(12) United States Patent
Gao et al.

(10) Patent No.: US 11,591,716 B2
(45) Date of Patent: Feb. 28, 2023

(54) ULTRA-HARD CARBON FILM FROM EPITAXIAL TWO-LAYER GRAPHENE

(71) Applicants: RESEARCH FOUNDATION OF THE CITY UNIVERSITY OF NEW YORK, New York, NY (US); NEW YORK UNIVERSITY, New York, NY (US)

(72) Inventors: Yang Gao, New York, NY (US); Tengfei Cao, New York, NY (US); Filippo Cellini, New York, NY (US); Elisa Riedo, New York, NY (US); Angelo Bongiorno, New York, NY (US)

(73) Assignees: Research Foundation of the City University of New York, New YorK, NY (US); New York University, New York, NY (US)

( * ) Notice: Subject to any disclaimer, the term of this patent is extended or adjusted under 35 U.S.C. 154(b) by 251 days.

(21) Appl. No.: 16/757,306

(22) PCT Filed: Oct. 22, 2018

(86) PCT No.: PCT/US2018/056896
§ 371 (c)(1),
(2) Date: Apr. 17, 2020

(87) PCT Pub. No.: WO2019/079800
PCT Pub. Date: Apr. 25, 2019

(65) Prior Publication Data
US 2021/0404091 A1    Dec. 30, 2021

Related U.S. Application Data

(60) Provisional application No. 62/575,153, filed on Oct. 20, 2017.

(51) Int. Cl.
*C30B 33/00* (2006.01)
*C01B 32/194* (2017.01)
(Continued)

(52) U.S. Cl.
CPC ............ *C30B 33/00* (2013.01); *A41D 31/245* (2019.02); *A42B 3/04* (2013.01); *C01B 32/194* (2017.08);
(Continued)

(58) Field of Classification Search
CPC ..... C01B 32/194; C01B 9/04; C01B 2204/04; C01B 2204/26; C30B 33/00; C30B 33/025; C30B 29/02
(Continued)

(56) References Cited

U.S. PATENT DOCUMENTS 5,669,644 A    9/1997 Kaihotsu et al.
5,880,042 A    3/1999 Schuster et al.
(Continued)

FOREIGN PATENT DOCUMENTS

CN    102093081 A    6/2011

OTHER PUBLICATIONS

Proctor "High-pressure Raman spectroscopy of graphene." Physical Review B 80, 073408 (Year: 2009).*
(Continued)

*Primary Examiner* — Tri V Nguyen
(74) *Attorney, Agent, or Firm* — Foley & Lardner LLP

(57) ABSTRACT

An ultra-hard carbon film is formed by the uniaxial compression of thin films of graphene. The graphene films are two or three layers thick (2-L or 3-L). High pressure compression forms a diamond-like film and provides improved properties to the coated substrates.

18 Claims, 22 Drawing Sheets

(51) Int. Cl.
*A41D 31/24* (2019.01)
*A42B 3/04* (2006.01)
*C30B 23/02* (2006.01)
*C30B 29/02* (2006.01)
*F41H 5/04* (2006.01)

(52) U.S. Cl.
CPC ............ *C30B 23/025* (2013.01); *C30B 29/02* (2013.01); *F41H 5/0414* (2013.01); *C01B 2204/04* (2013.01); *C01B 2204/26* (2013.01); *C01P 2004/03* (2013.01); *C01P 2004/04* (2013.01)

(58) Field of Classification Search
USPC ....................... 423/445 R, 448, 460; 428/336
See application file for complete search history.

(56) References Cited

U.S. PATENT DOCUMENTS

| | | | |
|---|---|---|---|
| 7,416,786 B2* | 8/2008 | Oda | C23C 14/024 428/408 |
| 9,227,848 B2 | 1/2016 | Kusunoki et al. | |
| 2006/0003545 A1* | 1/2006 | Veerasamy | C23C 14/0664 438/428 |
| 2011/0256371 A1* | 10/2011 | Layyous | C23C 28/044 427/249.7 |
| 2015/0228728 A1 | 8/2015 | Dimitrakopoulos | |
| 2017/0256406 A1* | 9/2017 | Cheng | B82B 3/008 |
| 2017/0368784 A1* | 12/2017 | Konyu | F41H 5/0492 |

OTHER PUBLICATIONS

Ni "Raman spectroscopy of epitaxial graphene on a SiC substrate." Physical Review B 77, 115416 (Year: 2008).*
Bousige "Biaxial Strain Transfer in Supported Graphene." Nano Lett. 2017, 17, 21-27 (Year: 2016).*
Aust & Drickamer, "Carbon: A New Crystalline Phase," Science 140(3568), pp. 817-819 (1963).
Barboza, et al., "Room-Temperature Compression-Induced Diamondization of Few-Layer Graphene," Advanced Materials 23(27), pp. 3014-3017 (2011).
Berger, et al., "Electronic Confinement and Coherence in Patterned Epitaxial Graphene," Science 312(5777), pp. 1191-1196 (2006).
Berger, et al., "Epitaxial graphene on Sic: 2D sheets, selective growth and nanoribbons," Condensed Matter: Mesoscale and Nanoscale Physics, arXiv:1611.08937, 19 pages (2016).
Bundy, et al., "The pressure-temperature phase and transformation diagram for carbon; updated through 1994," Carbon 34(2), pp. 141-153 (1996).
Castro Neto, et al., "The electronic properties of graphene," Reviews of Modern Physics 81(1), pp. 109-162 (2009).
Chernozatonskii, et al., "Diamond-like C2H nanolayer, diamane: Simulation of the structure and properties," JETP Letters 90, pp. 134-138 (2009).
Chiu, et al., "Morphology dependence of radial elasticity in multiwalled boron nitride nanotubes," Applied Physics Letters 101(10), 103109, 5 pages (2012).
Cynn, et al., "Osmium has the Lowest Experimentally Determined Compressibility," Physical Review Letters 88, 135701, 4 pages (2002).
De Heer, et al., "Large area and structured epitaxial graphene produced by confinement controlled sublimation of silicon carbide," Proceedings of the National Academy of Sciences 108(41), pp. 16900-16905 (2011).
Deng, et al., "Mechanical Behavior of Multilayered Nanoscale Metal-Ceramic Composites," Advanced Engineering Materials 7(12), pp. 1099-1108 (2005).
Filleter, et al., "Local work function measurements of epitaxial graphene," Applied Physics Letters 93(13), 133117, 3 pages (2008).

Gallagher, et al., "Switchable friction enabled by nanoscale self-assembly on graphene," Nature Communications 7, 10745, 7 pages (2016).
Gao, et al., "Elastic coupling between layers in two-dimensional materials," Nature Materials 14, pp. 714-720 (2015).
Giannozzi, et al., "Quantum Espresso: a modular and open-source software project for quantum simulations of materials," Journal of Physics: Condensed Matter 21(39), 36 pages (2009).
Gorrini, et al., "On the thermodynamic path enabling a room-temperature, laser-assisted graphite to nanodiamond transformation," Scientific Reports 6, 35244, 9 pages (2016).
Green & Sader, "Torsional frequency response of cantilever beams immersed in viscous fluids with applications to the atomic force microscope," Journal of Applied Physics 92(10), 6262, 12 pages (2002).
Grimme, "Semiempirical GGA-type density functional constructed with a long-range dispersion correction," Journal of Computational Chemistry 27(15), pp. 1787-1799 (2006).
Horbatenko, et al., "Synergetic interplay between pressure and surface chemistry for the conversion of $sp^2$-bonded carbon layers into $sp^3$-bonded carbon films," Carbon 106, pp. 158-163 (2016).
International Search Report & Written Opinion for PCT/US2018/056896 dated Jan. 17, 2019, 7 pages.
Jaglinski, et al., "Composite Materials with Viscoelastic Stiffness Greater Than Diamond," Science 315(5812), pp. 620-622 (2007).
Johansson, et al., "Multiple p-bands and Bernal stacking of multilayer graphene on C-face SIC, revealed by nano-Angle Resolved Photoemission," Scientific Reports 4, 4157, 6 pages (2015).
Khaliullin, et al., "Nucleation mechanism for the direct graphite-to-diamond phase transition," Nature Materials 10, pp. 693-697 (2011).
Kulikovsky, et al., "Hardness and elastic modulus of amorphous and nanocrystalline SiC and Si films," Surface and Coatings Technology 202(9), pp. 1738-1745 (2008).
Kumar & Parks, "Strain Shielding from Mechanically Activated Covalent Bond Formation during Nanoindentation of Graphene Delays the Onset of Failure," Nano Letters 15(3), pp. 1503-1510 (2015).
Kvashnin & Sorokin, "Lonsdaleite Films with Nanometer Thickness," The Journal of Physical Chemistry Letters 5(3), pp. 541-548 (2014).
Kvashnin, et al., "Phase Diagram of Quasi-Two-Dimensional Carbon, From Graphene to Diamond," Nano Letters 14(2), pp. 676-681 (2014).
Lucas, et al., "Aspect Ratio Dependence of the Elastic Properties of ZnO Nanobelts," Nano Letters 7(5), pp. 1314-1317 (2007).
Lucas, et al., "Tip size effects on atomic force microscopy nanoindentation of a gold single crystal," Journal of Applied Physics 104(11), 113515, 5 pages (2008).
Luo, et al., "Thickness-Dependent Reversible Hydrogenation of Graphene Layers," ACS Nano 3(7), pp. 1781-1788 (2009).
Mao, et al., "Bonding Changes in Compressed Superhard Graphite," Science 302(5644), pp. 425-427 (2003).
Narayan, et al., "Laser Method for Synthesis and Processing of Continuous Diamond Films on Nondiamond Substrates," Science 252(5004), pp. 416-418 (1991).
Odkhuu, et al., "Conversion of multilayer graphene into continuous ultrathin sp3-bonded carbon films on metal surfaces," Scientific Reports 3, 3276, 7 pages (2013).
Palaci, et al., "Radial Elasticity of Multiwalled Carbon Nanotubes," Physical Review Letters 94(17), 175502, 4 pages (2005).
Park, et al., "Structural and electronic properties of cubic, 2H, 4H, and 6H SiC," Physical Review B 49(7), pp. 4485-4493 (1994).
Perdew, et al., "Generalized Gradient Approximation Made Simple," Physical Review Letters 77(18), 3865, 4 pages (1996).
Rajasekaran, et al., "Interlayer Carbon Bond Formation Induced by Hydrogen Adsorption in Few-Layer Supported Graphene," Physical Review Letters 111(8), 085503, 5 pages (2013).
Richter, et al., "Nanoindentation of diamond, graphite and fullerene films," Diamond and Related Materials 9(2), pp. 170-184 (2000).
Riedl, et al., "Structural and electronic properties of epitaxial graphene on SIC(0?0?0?1): a review of growth, characterization,

(56) References Cited

OTHER PUBLICATIONS transfer doping and hydrogen intercalation," Journal of Physics D: Applied Physics 43(37), 17 pages 374009 (2010).
Sader, et al., "Calibration of rectangular atomic force microscope cantilevers," Review of Scientific Instruments 70(10), pp. 3967-3969 (1999).
Scandolo, et al., "Pressure-Induced Transformation Path of Graphite to Diamond," Physical Review Letters 74, 4015, 4 pages (1995).
Wei, et al., "Nanoscale Tunable Reduction of Graphene Oxide for Graphene Electronics," Science 328(5984), pp. 1373-1376 (2010).
Xie, et al., "Mechanism for direct graphite-to-diamond phase transition," Scientific Reports 4, 5930, 5 pages (2015).

* cited by examiner

FIG. 14A
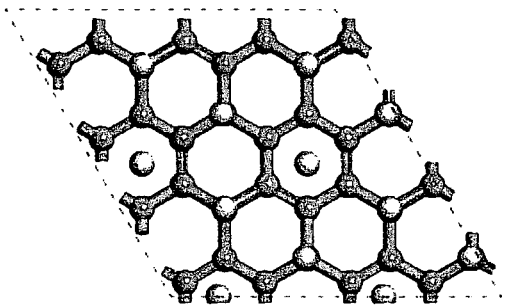
FIG. 14B
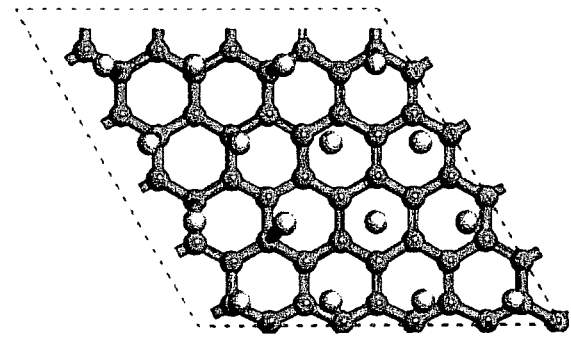
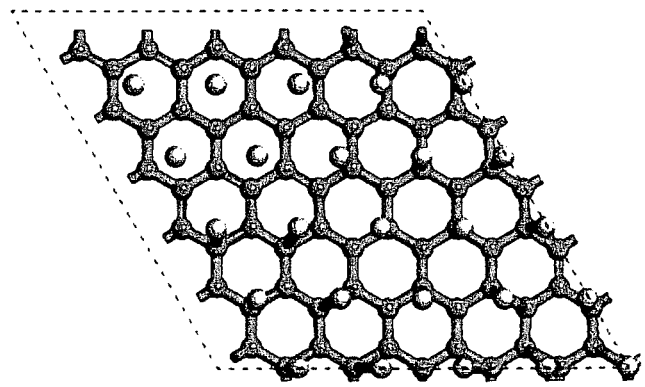
FIG. 14C

ULTRA-HARD CARBON FILM FROM EPITAXIAL TWO-LAYER GRAPHENE

CROSS-REFERENCE TO RELATED APPLICATIONS

This application is the U.S. national phase of International Application No. PCT/US2018/056896 filed Oct. 22, 2018, which claims priority to and is a non-provisional of U.S. Provisional Patent Application No. 62/575,153 (filed Oct. 20, 2017), both of which are incorporated herein by reference in their entirety.

STATEMENT OF FEDERALLY SPONSORED RESEARCH OR DEVELOPMENT

This invention was made with government support under grant number DE-SC0016204 awarded by the U.S. Department of Energy. The government has certain rights in the invention.

BACKGROUND OF THE INVENTION

The subject matter disclosed herein relates to the formation of ultra-hard carbon films. The quest for materials with exceptional mechanical properties is the focus of major efforts since the beginning of civilization. Carbon can form different types of materials, exhibiting a variety of exceptional properties, from diamond to graphite, and more recently fullerenes, nanotubes, and graphene. Sintering materials with a stiffness and hardness equal or superior to those of diamond is an ongoing challenge. Thus, for both scientific and technological reasons, the transformation of graphite into diamond remains one of the most fascinating and studied solid-to-solid phase transitions in materials science. Recently, experimental and theoretical efforts have been directed to study the transformation of multi-layer graphene into a diamond-like structure, as induced by chemical functionalization of the graphene layers. Despite recent successes, the experimental proof that such atomically-thin diamond-like films indeed exhibit mechanical properties similar to those of diamond remains, unfortunately, missing.

The discussion above is merely provided for general background information and is not intended to be used as an aid in determining the scope of the claimed subject matter.

BRIEF DESCRIPTION OF THE INVENTION

An ultra-hard carbon film is formed by the uniaxial compression of thin films of graphene. The graphene films are two or three layers thick (2-L or 3-L). High pressure compression forms a diamond-like film and provides improved properties to the coated substrates.

In a first embodiment, a composition of matter is provided. The composition comprises: a silicon carbide substrate having a surface; and an ultra-hard carbon film disposed on the surface, wherein the ultra-hard carbon film is between 4 Å and 10 Å thick and has a hardness greater than 100 GPa.

In a second embodiment, 1 method for producing an ultra-hard carbon film is provided. The method comprising: uniaxially compressing a graphene film to a surface of silicon carbide with a pressure between 1 GPa and 10 GPa, wherein the graphene film has a thickness between 4 Å and 10 Å and consists of two layers (2-L) or three layers (3-L) of graphene, thereby forming an ultra-hard carbon film with a thickness between 4 Å and 10 Å and a hardness greater than 100 GPa.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIG. 1C is a TEM image of a 5-L graphene on SiC(0001) with a scale bar of 5 nm while

FIG. 1E is a TEM image of a buffer layer on SiC(0001) with a scale bar of 5 nm while

FIG. 2A is an indentation curve of a 2-L graphene on SiC(00001) while

FIGS. 14A to 14C shows ball and stick images of unrelaxed configurations of the interface between graphene and the Si-face of a SiC(0001) substrate. The hexagonal supercells are obtained by matching; FIG. 14A shows a periodic unit cell of graphene containing 4×4 elementary unit cells with a $2\sqrt{3} \times 2\sqrt{3}R30°$ surface unit-cell of SiC(0001) (Int-A); FIG. 14B shows a 5×5 graphene cell with a 4×4 surface unit cell of SiC(0001) (Int-B), and FIG. 14C shows a 6×6 graphene cell with a 5×5 surface periodic cell of SiC(0001) (Int-C).

DETAILED DESCRIPTION OF THE INVENTION

Figure 1A:
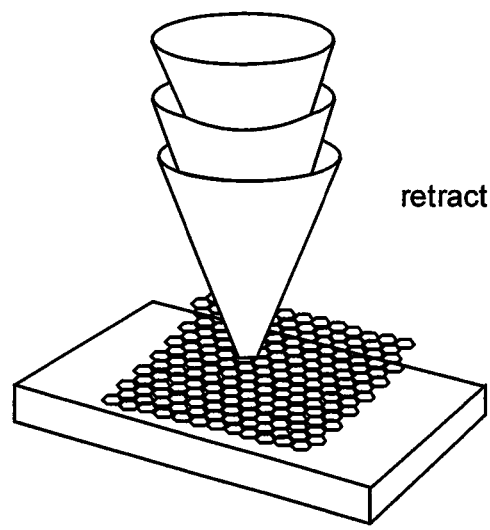
FIG. 1A is a schematic of an experiment performed in retracting mode.

This disclosure shows that at room temperature (e.g. 20° C. to 30° C.) and after nano-indentation, two-layer graphene on SiC(0001) exhibits a transverse stiffness and hardness comparable to diamond, resisting to perforation with a diamond indenter, and shows a reversible drop in electrical conductivity upon indentation. Density functional theory calculations suggest that upon compression, the two-layer graphene film transforms into a diamond-like film, producing both elastic deformations and $sp^2$-to-$sp^3$ chemical changes. Experiments and calculations show that this reversible phase change is not observed for a single buffer layer on SiC or graphene films thicker than 3 to 5 layers. Calculations show that whereas in two-layer graphene layer-stacking configuration controls the conformation of the diamond-like film, in a multilayer film it hinders the phase transformation.

The disclosed ultra-hard carbon film is a new phase of carbon that is induced during uniaxial compression of a 2-L (double-layer) graphene film on silicon carbide (SiC). The 2-L film consists of a buffer layer of graphene and a monolayer of graphene. The phase transition occurs at room temperature and leads to the formation of a diamond-like phase with mechanical properties that are comparable to or better than those of diamond. The film is an ultrastiff (elastic modulus~1 TPa), ultrathin (1-2 atomic layers), optically transparent, and chemically stable (under compression) coating that is formed during compression of 2-L graphene on the surface of SiC, increasing enormously the surface stiffness of this material at the nanoscale. In one embodiment, the graphene is 4 Å to 10 Å thick. In another embodiment, the graphene is 14 Å to 7 Å thick. In yet another embodiment, the graphene is 4 to 6 Å thick. After compressing, the thickness of the resulting ultra-hard carbon film is substantially unchanged. A 2-L graphene layer is commonly about 5 Å thick.

The film is observed during uniaxial compression of the 2-L graphene film. The pressure may be applied on the 2-L graphene film through the tip of an Atomic Force Microscope's cantilever with normal force on the order of few hundreds Nanonewtons (e.g. 30 nN to 900 nN). Indentation measurements show that stiffness of the thin film is comparable to the stiffness of diamond (above 1 TPa). Evidence of the unprecedented mechanical properties of the 2-L graphene film on SiC is also found through indentation of the film with a diamond indenter. More specifically, while the diamond indenter can easily indent the bare SiC substrate, the diamond indenter is unable to penetrate the 2-L graphene film. In other embodiments, hexagonal structures other than graphene may be used. In one embodiment, hexagonal boron nitride (BN) is used. Formation can be leveraged to improve mechanical properties of SiC substrates, with relevant applications in the semiconductors' industry as well as in the aerospace and defense industry. The coatings may also be useful in mechanical applications including the production of protective coatings such as protective armor, vests and helmets (e.g. bullet-resistant armor).

In this disclosure, sub-Å resolution modulated nano-indentation (MoNI) atomic force microscopy (AFM) experiments, micro-hardness, and AFM conductivity measurements, combined with density functional theory (DFT) calculations show that at room temperature, indentation in a two-layer epitaxial graphene film grown on SiC(0001) induces a reversible transformation of the film to a diamond-like structure, leading to stiffness and hardness values comparable to those of diamond. In particular, during the MoNI experiments presented in this disclosure, a Si spherical probe with a radius of 120 nm is used to indent SiC and epitaxial graphene films of various thicknesses, reaching loads of the order of 100 nN, corresponding to pressures of about 1-10 GPa considering the contact area between the spherical tip and the flat substrate, and indentation depths ranging from 0.6 to 6 Å, depending on the thickness of the multilayer graphene film. After indenting a multi-layer graphene film on SiC, force versus indentation curves are collected while retracting the tip with sub-Å resolution. These experiments show that the transverse elastic modulus of multi-layer epitaxial graphene on SiC (0001) for a number of layers larger than five is close to the Young's modulus of graphite in the direction perpendicular to the basal plane, i.e. about 30 GPa, and for a single carbon layer on SiC (0001)—the graphene buffer layer—the Young's modulus is the same as for bare SiC. However, very surprisingly, the transverse stiffness of a two-layer (2-L) epitaxial graphene on SiC (0001) is much larger than that of the bare SiC substrate, i.e. >400 GPa. Furthermore, micro-hardness measurements show that 2-L epitaxial graphene resists plastic deformations upon indentation with a diamond indenter, even at the maximum loads of 30 µN; whereas similar loads can easily produce holes in both SiC and multi-layer epitaxial graphene for films thicker than five layers (5-L). DFT calculations indicate that the unique mechanical response to indentation of 2-L graphene stems from its ability to undergo a structural transformation into a diamond-like film, and that such ability is hindered in 3-L or thicker films by unfavorable layer stacking configurations. In some embodiments, the carbon film can be formed from a 3-L structure but higher pressures are used relative to the 2-L embodiment. This theory is further confirmed by the experimental observation of a reversible decrease in electrical conductivity induced by indentation in 2-L graphene, absent in 5-L graphene. In particular, DFT calculations show that the $sp^2$-to-$sp^3$ structural changes in a 2-L graphene film on SiC(0001) are facilitated by the presence of a buckled buffer layer in contact with the incommensurable and reactive Si-terminated face of the SiC substrate, that they occur upon indentation regardless of the nature of the layer stacking configuration, and that the resulting diamond-like film does not necessitate the presence of adsorbates to passivate and stabilize the surface of the film in contact with the indenter. In other embodiments, alternative substrates are used instead of the SiC substrate.

Stiffness Measurements for 0, 1, 2, 5-L Graphene on SiC

Graphene films are grown epitaxially on the SiC(0001) surface by thermal sublimation. Sub-Å resolved nano-indentation curves are obtained by modulated nano-indentation. In a MoNI experiment, a silicon tip is brought into hard contact with a graphene film. The tip indents the sample until it reaches a normal force of 50 to 300 nN. The actual measurement is taken after forming the hard contact, i.e. during the process of retracting the AFM tip from the supported film at a rate of about 0.01 nm/s (FIG. 1A). At this point, the normal force is gradually reduced, while vertically oscillating the tip-holder with a about 0.1 Å amplitude at a fixed frequency, by means of a lock-in amplifier. For each value of the normal force between tip and sample, $F_z$ (which is controlled and kept constant by the feedback loop of the AFM), a lock-in amplifier is used to measure the slope of the force vs. indentation depth curve, namely the contact stiffness $k_{cont}(F_z)$. Force vs. indentation depth curves with sub-Å resolution are then obtained by integrating the equation $dF_z = k_{cont}(F_z) \cdot dZ_{indent}$ as follows:

$$Z_{indent}(F_z) = \int \frac{dF'_z}{k_{cont}(F'_z)} \quad (1)$$

For simplicity, and despite its limitations, this disclosure uses the Hertz model to extract elastic moduli from experimental force vs. indentation depth curves. In previous studies, MoNI measurements and the Hertz model were used successfully to probe and characterize the elasticity of bulk materials, including very stiff materials such as SiC (FIG. 1B), as well as the radial elasticity of nanotubes and the interlayer elasticity in graphene oxide films. High resolution of the indentation curves obtained from MoNI experiments allows to measure the Young's modulus of materials that are stiffer than the Si tip.

Figure 1B:
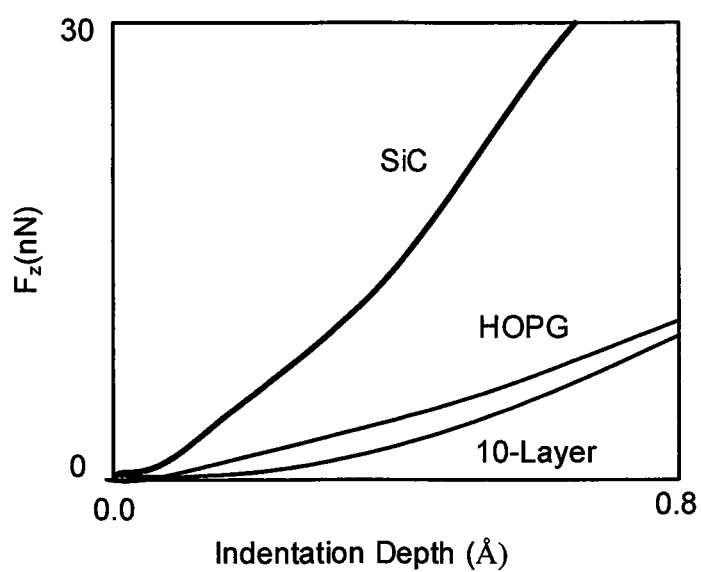
FIG. 1B is a graph showing Indentation curves of SiC, HOPG and 10-L graphene on SiC (000-1)
Figure 1C:
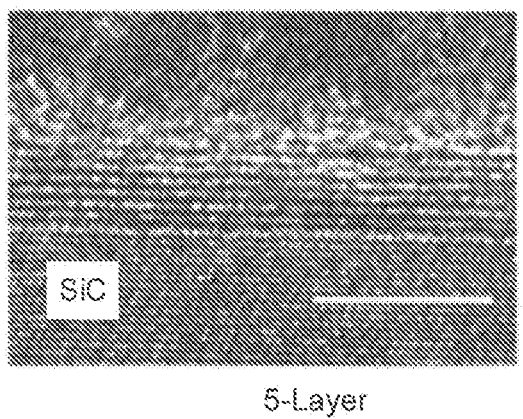
Figure 1D:
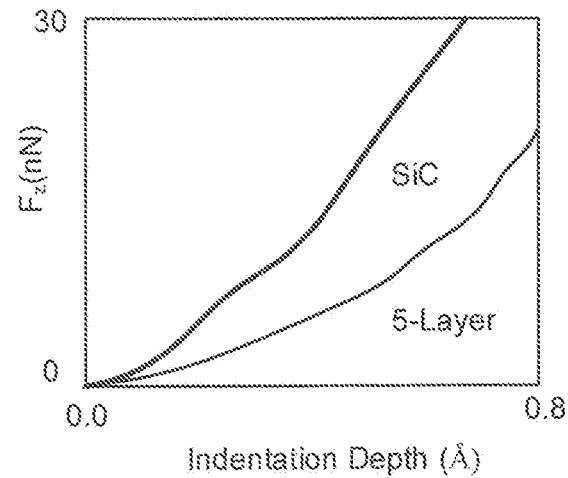
FIG. 1D is an indentation curve of a 5-L graphene on SiC(00001)
Figure 1E:
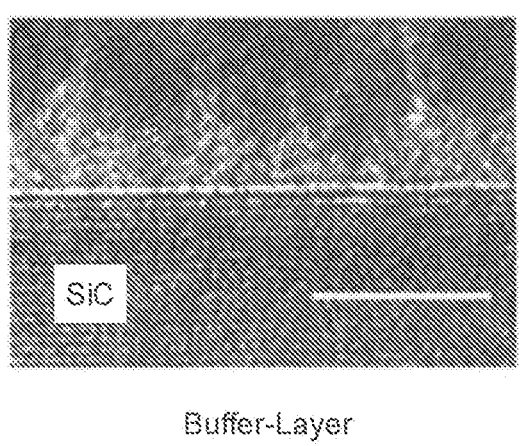
Figure 1F:
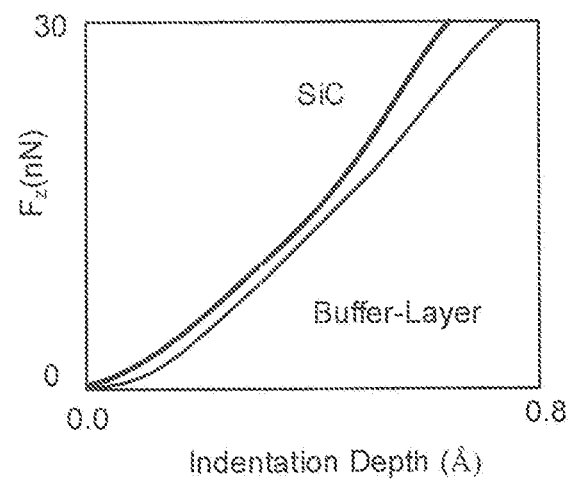
FIG. 1F is an indentation curve of a buffer layer on SiC(00001)
Figure 2A:
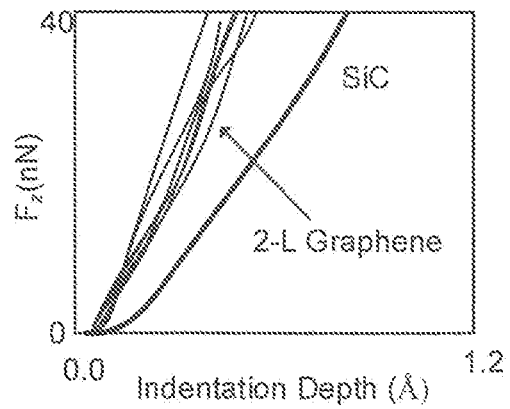
Figure 2B:
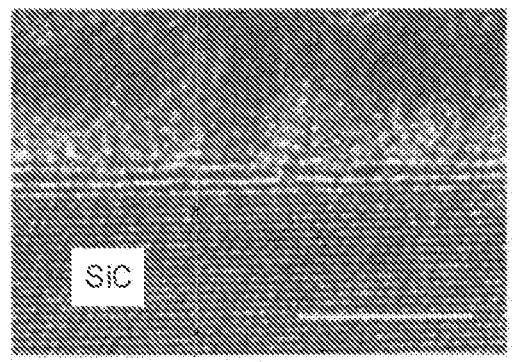
FIG. 2B is a TEM image of a 2-L graphene on SiC(0001) with a scale bar of 5 nm.

The MoNI technique was used to probe the vertical elastic modulus of 10-L, 5-L, 2 L and a single graphene layer in contact with the Si-face of SiC(0001), i.e. the buffer layer. In these experiments, the maximum indentation depth ranges from 0.6 in the case of 2-L graphene up to 6 Å in the case of 10-L graphene, and the experimental errors on the tip normal force, $F_z$, and indentation depth are $\Delta F_z=0.5$ nN and $\Delta z=0.01$ nm, respectively. To probe the number of layers in the graphene films, transmission electron microscopy (TEM) and scanning TEM (STEM) measurements were obtained, as well as Raman spectroscopy and Kelvin Probe Force Microscopy (KPFM) experiments. TEM images and force vs. indentation depth curves of 5-L graphene (see FIG. 1C and FIG. 1D), the buffer layer (see FIG. 1E and FIG. 1F), and 2-L graphene (see FIG. 2A and FIG. 2B) are shown side by side. The indentation curves shown in FIG. 1B result from averaging more than 10 curves obtained from MoNI measurements of different spots on different samples. In FIG. 1B, the indentation curve of 10-L graphene is very close to that obtained for bulk Highly Ordered Pyrolytic Graphite (HOPG). The elastic modulus derived by fitting the indentation curve for 10-L graphene with a Hertz model is about 36 GPa, very close to the c-axis Young's modulus of graphite; the indentation curve for 10-L reaching a depth of 6 Å. FIG. 1D and FIG. 1F show the indentation curves of a bare SiC substrate together with the curves of a supported 5-L graphene film and the buffer layer, respectively. Analysis of the indentation curve of SiC yields, in agreement with published values, a Young's modulus of 400 GPa, whereas the curves for the buffer layer and the 5-L film clearly show that coating SiC with a graphene film leads to a softening of the elastic modulus measured by the MoNI technique. Although the exact nature of the buffer layer is still under scrutiny, the notion that it consists of a graphene layer interacting strongly with the SiC substrate is well accepted, and thus it does not surprise that its effect on the indentation curve is detectable but mild. On the other hand, a 5-L graphene film exhibits a transverse elastic modulus comparable to that of a graphitic system, and its softening effect of the elastic modulus of the entire system, substrate plus 5-L film, is significant and almost comparable to that of a 10-L graphene film. Overall, all these elastic behaviors are expected and well-understood to arise when a rigid substrate is coated by a thin film of a softer material of increasing thickness, and indeed the indentation curves for 10-L, 5-L and buffer layer graphene on SiC follow a predictable trend. However, and very surprisingly, when two layers of graphene are indented on SiC, as shown in FIG. 2A with the corresponding TEM image (FIG. 2B), force vs. indentation curves were obtained which are much steeper than those for 5-L or 10-L graphene and even steeper than bare SiC. Such large stiffness for 2-L epitaxial graphene corresponds to a transverse Young's modulus much larger than the modulus of SiC, i.e. >>400 GPa, indicating that a 2-L graphene film can enhance significantly the stiffness of the substrate. In the detail, since the Hertz model is appropriate for isotropic bulk materials, here a simple Hertz fit is inadequate to extract from these elastic indentation curves the exact value of the transverse Young's modulus of the isolated atomically thin 2-L film. Nevertheless, the experimental elastic indentation curves of 2-L graphene on SiC clearly indicate that important physical/chemical effects must happen in the 2-L film to explain the stiffening effect produced by coating SiC(0001) with a 2-L graphene film. Computational modeling work (vide infra), in agreement with recent theoretical works and indentation studies of suspended single layer graphene, suggests that the ultra-stiffening caused by 2-L graphene is due to a transformation from a layered into a diamond-like structure occurring in the 2-L carbon film upon indentation, namely when the AFM tip approaches and presses upon the supported film.

Micro-Hardness and Conductivity Measurements Upon Indentation

Figure 3A:
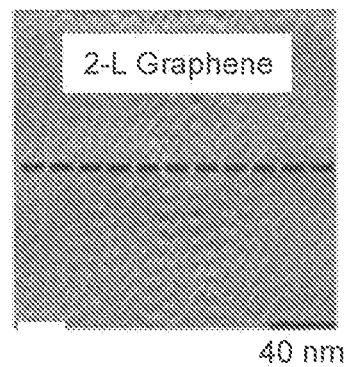
FIG. 3A is an AFM topographical image of the residual indents on 2-L graphene.
Figure 3B:
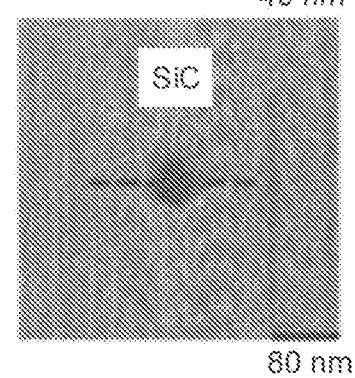
FIG. 3B is an AFM topographical image of the residual indents on 5-L graphene.
Figure 3C:
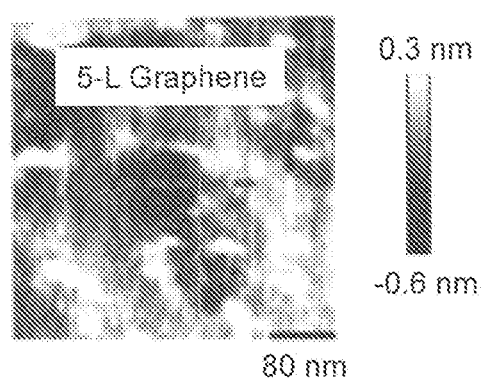
FIG. 3C is an AFM topographical image of the residual indents upon indentation with a diamond indenter.
Figure 3D:
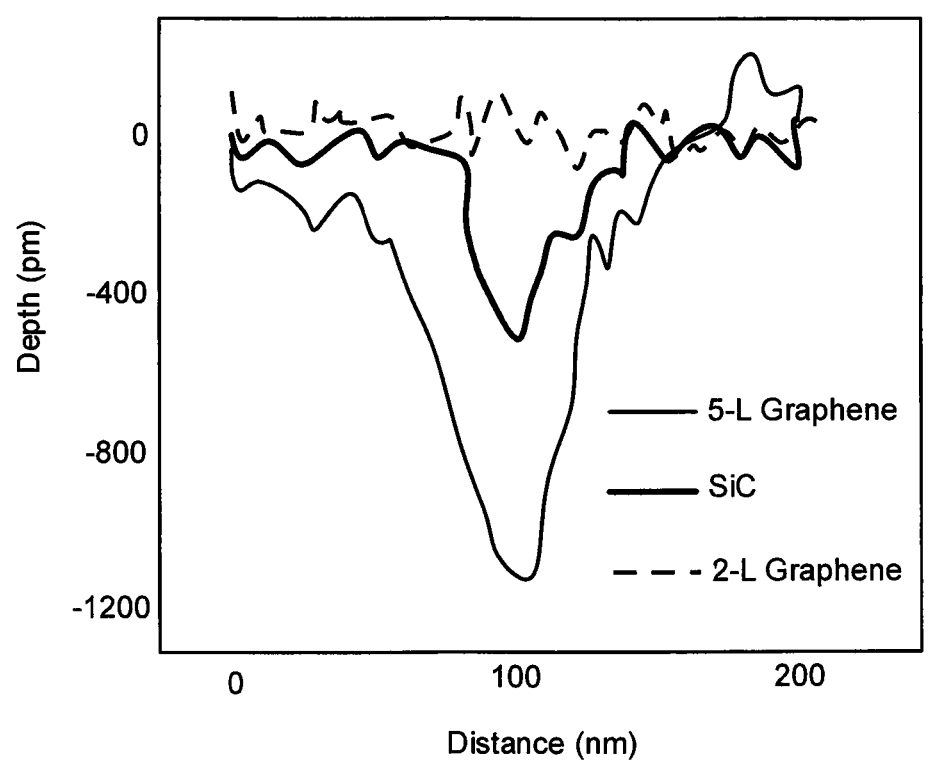
FIG. 3D is a graph of depth of indents in a cross-section profile of the residual indents in 2-L graphene, SiC and 5-L graphene.

To further challenge the existence of a diamond phase induced by pressure in two-layer epitaxial graphene, micro-hardness experiments were performed (FIG. 3A, FIG. 3B, FIG. 3C and FIG. 3D) with a diamond indenter using loads up to 12 μN on a 2-L and a 5-L graphene film on SiC(0001), as well as on a bare SiC substrate. Quite unexpectedly, although in agreement with MoNI measurements, upon indentation and after subsequent AFM topographic imaging, no residual indent is found in 2-L epitaxial graphene on SiC, see FIG. 3A, indicating a hardness value close if not superior to that of the diamond indenter (e.g. greater than 100 GPa). By contrast, when indenting a bare SiC sample with the same indenter and load, a residual indent (diameter about 30-40 nm) was identified, FIG. 3B. Furthermore, a larger and deeper residual indent is observed when indenting with the same conditions 5-L epitaxial graphene (diameter about 60-70 nm) as shown in FIG. 3C. These experiments estimate a hardness for SiC of 20±10 GPa, which is close to hardness values reported in literature, as well as a value of hardness for the 5-L graphene film of the order of 5±2 GPa, which is similar to the hardness of HOPG. The change from a hardness of 5±2 GPa to greater than 100 GPa shows the disclosed method increases the hardness of the film by at least 75 GPa.

Figure 3E:
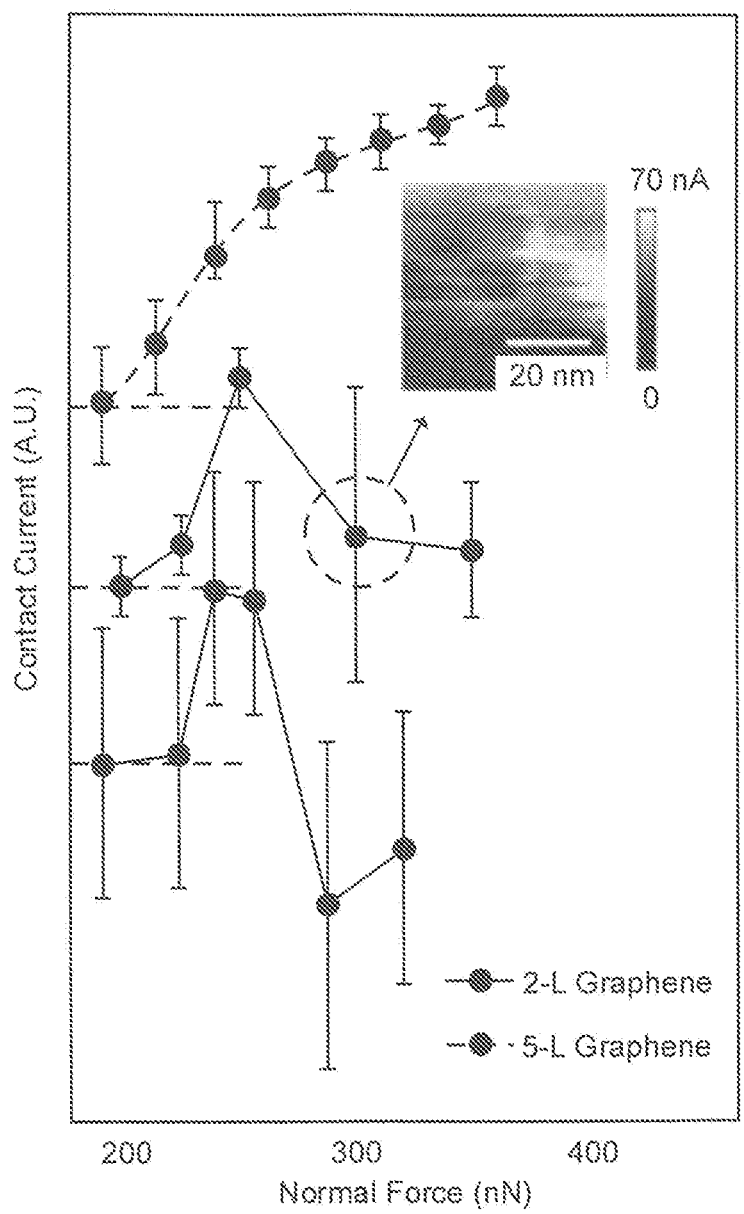
FIG. 3E is a graph of three stacked curves of the average current signal vs. normal load as measured by C-AFM on areas of 50×50 $nm^2$ on two different 2-L graphene films and a 5-L graphene film. A current drop is observed at about 260 nN only for 2-L graphene samples. The inset shows a current image recorded on 2-L graphene at 300 nN while scanning from top to bottom, indicating a drop in current occurring after a few scans. These current vs. load curves are reversible when decreasing the load.

Load-dependent conductive AFM (C-AFM) experiments were also conducted on 2-L and 5-L graphene films on SiC, see FIG. 3E. These experiments are conducted by using a metallic AFM tip to apply pressure and simultaneously collect the electrical current flowing between the tip and a silver electrode deposited on the graphene film surface under the influence of a constant voltage bias. Current measurements are taken while varying the tip load from 200 up to 400 nN. FIG. 3E displays the current measurements for the 5-L and 2-L graphene films on SiC. In the 5-L film, the current increases for increasing normal load, consistent with the increase in contact area and hence in the electrical contact between tip and film. Instead, for 2-L films these experiments show that although the current initially increases with load, for loads greater than 260 nN the current suddenly drops, suggesting that at these loads the 2-L film undergoes a phase transition to a structure with a larger $sp^3$ content and thus more resistive. C-AFM experiments on different 2-L samples (e.g. two samples shown in FIG. 3E) but same AFM tip show that the structural transition consistently occurs at a load of about 270 nN. The observed decrease in electrical conductivity induced by indentation in 2-L graphene is fully reversible upon decrease of load, suggestive of a spontaneous healing of the transformed nucleus taking place at room temperature. Variations in the observed absolute values of current in the different films are attributable to inhomogeneity of the film surface, quality of the silver contact, distance between measured region and silver electrode, and tunneling phenomena at the periphery of the tip-film contact.

DFT and Indentation Simulations

MoNI, micro-hardness, and conductive AFM experiments show that the mechanical response to indentation of a 2-L graphene film on SiC(0001) is inconsistent with the picture of a substrate coated by a carbon film with a graphitic-like structure, which should lead to a softening of the transverse elasticity as observed for a 5-L or 10-L film on SiC. DFT calculations and classical indentation simulations based on Hookean force fields indicate that the ultra-stiffness exhibited by 2-L graphene on SiC arises from a mechanochemical effect; namely, in addition to deformations, the mechanical load on a 2-L graphene SiC-supported film gives rise to $sp^2$-to-$sp^3$ structural and chemical changes that ultimately lead to the formation of a stiff diamond-like film coating the SiC substrate. To corroborate this picture, an extensive set of DFT calculations were carried out, as well as indentation simulations based on Hookean force fields.

Figure 4A:
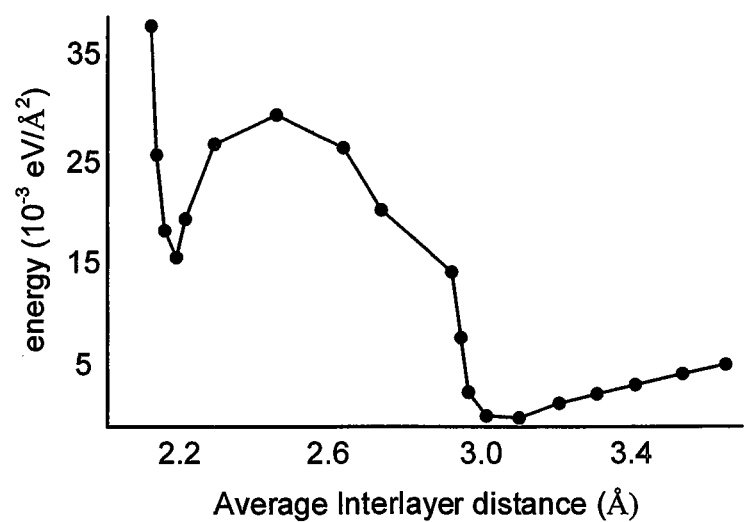
FIG. 4A is a graph showing energy per unit area obtained by DFT calculations for a two-layer graphene film sandwiched between mirroring H—CSi layers; the graphene layers include 4×4 elementary unit cells in contact with a SiC(0001) substrate having a periodicity of $2\sqrt{3} \times 2\sqrt{3}R30°$. Energy values are referred to the smallest ones of the set and are plotted vs. the average distance between the carbon layers of graphene (right inset) and diamond-like (left inset) films.

A graphene film interacts strongly with the Si-face of a SiC(0001) substrate. To gain insight on how this interface may influence elastic properties and structural transformations of a carbon film supported by SiC, model structures of 2-, 3-, and 4-L graphene films sandwiched between simplistic representations of a SiC(0001) surface were considered, consisting of a single SiC(0001) layer with Si atoms in contact with the bottom and top layers of the carbon films, and the C atoms saturated by H atoms. Multilayer graphene films were considered with several different layer-stacking configurations, as well as supercells of increasing lateral size to mimic different interfacial structures between the buffer layer and the Si-face of SiC(0001), which are incommensurable. For each model structure, a sequence of DFT optimization calculations was carried out, in which the C atoms of the SiC layers are constrained to lie on planes at a fixed separation. These DFT calculations show that a 2-L graphene can transforms upon compression into a diamond-like film in contact with SiC(0001) (FIG. 4A). The $sp^2$-to-$sp^3$ structural and chemical changes occur regardless of the stacking configuration of the two graphene layers, they are favored by the presence of buckling distortions in the buffer layer and bonding at the contact with a the reactive SiC (0001) substrate, and they occur more favorably (i.e. the energy cost associated to the homogeneous transformation vanishes) by reducing the lattice mismatch at the interface between substrate and buffer layer. DFT calculations also show that the phase transformation to a diamond-like film in compressed 3-L and 4-L graphene films is hindered by the layer-stacking configuration. Calculations show that whereas a 3- or 4-L graphene film with the ABC (rhombohedral) or AAA (hexagonal) stacking configuration can transform upon compression into a diamond-like film, a film with the AB (Bernal) stacking configuration typical of multilayer graphene and graphite undergoes $sp^2$-to-$sp^3$ structural changes only in a portion of the film, which the unfavorable layer stacking prevents from propagating throughout the entire transverse direction. Moreover, DFT calculations based on these types of model structures (see FIG. 4A) show that a diamond-like film forms a hard contact with the SiC(0001) substrate, exhibiting an interfacial layer of bonds with a transverse elasticity (or elastic modulus) as stiff as that of the substrate material. This result is important and will be used in indentation simulations based on atomistic Hookean force fields (vide infra).

Figure 4B:
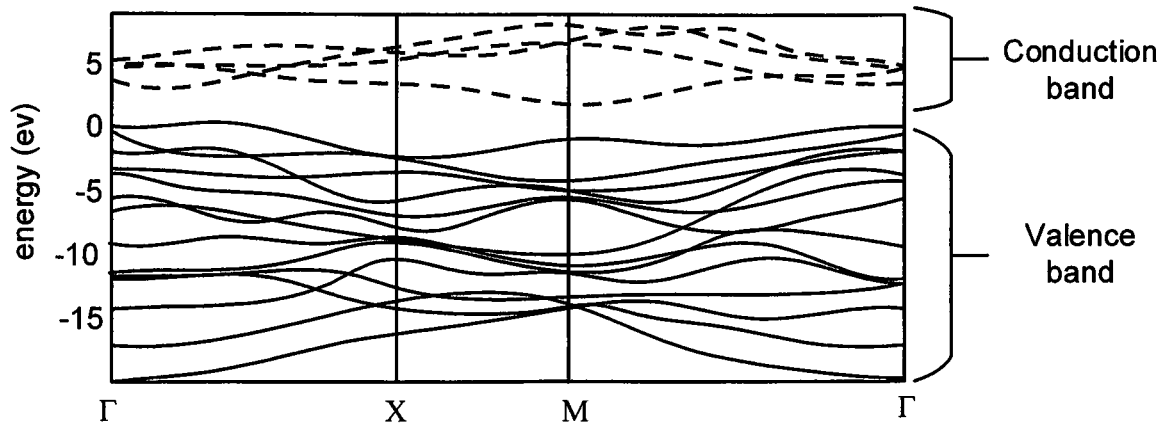
FIG. 4B is a graph showing energy per unit area with valence and conduction bands shown.

DFT calculations were also used to investigate the structure, mechanical, and electronic properties of diamond-like films resulting by compression of a 2-L graphene film. These calculations show that, regardless of the stacking configuration, two graphene layers buckles to form a diamond-like film exposing dangling bonds towards the vacuum region. Six possible configurations were constructed for a diamond-like film resulting by compressing a 2-L graphene film with a AA, AB, and AC stacking configuration, and H was used to saturate the dangling bonds on both surfaces of the film. These models and DFT calculations were used to estimate the transverse elastic modulus of a diamond-like film, finding values ranging from 0.30 up to 1.01 TPa, close to the Young's modulus calculated for bulk diamond. The stiffest film has the structure of hexagonal diamond (lonsdaleite) and results by compressing two graphene layers stacked in an AA configuration. Two of these six conformations for a diamond-like film exhibit surface geometries showing the occurrence of broken resonance structures, and DFT calculations indeed show that removal of the H atoms on one of the two surfaces of these symmetric diamond-like films leads to energetically stable carbon films exhibiting an electronic band gap of about 2 eV (FIG. 4B), exposing a clean and chemically inert surface to the vacuum. These results are in agreement with recent DFT studies.

Figure 4C:
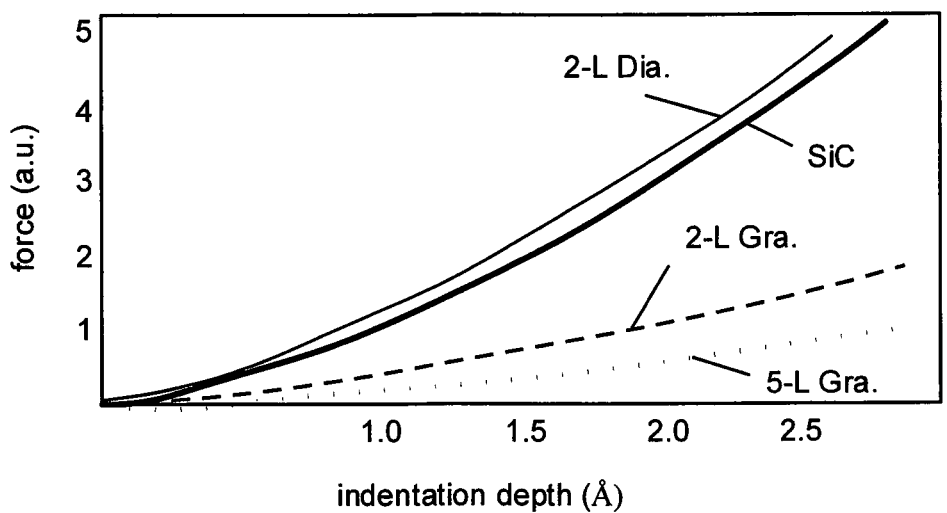
FIG. 4C is a force vs. indentation curves obtained by using a classical scheme based on atomistic model structures and Hookean force fields. Circles show calculated data, whereas solid lines show fits using a Hertz law. Simulations were carried out for a bare substrate (SiC), and for the same substrate coated with a 2-L film with the elastic moduli of a diamond-like (2-L Dia.) or graphene (2-L Gra.) film, as well as for a substrate coated with a 5-L graphene film (5-L Gra)

DFT calculations show that, upon compression, a 2-L graphene film on SiC(0001) transforms into a diamond-like film with a Young's modulus of up to 1.01 TPa. The interface between the carbon film and substrate consists of a thin layer of bonds whose transverse mechanical strength is comparable to that of bulk SiC, whereas the surface of the diamond-like film consists of either chemically inert regions exposing for instance the well-known dimer C—C reconstruction (FIG. 4B) or regions with dangling bonds that may be passivated by H or —OH species. This qualitative but important insight allows to model the process of a hard sphere indenting a hard ultra-thin film on a softer substrate. To this end, and to circumvent the limitations of continuum elasticity theory, we devise a classical scheme based on atomistic model structures and Hookean force fields. This simulation scheme, which is described in detail in the SI, is used to calculate the force vs. indentation depth curves for a substrate coated by a sub-nanometer-size film mimicking the elastic properties of either multilayer graphene or a diamond-like film, and thus exhibiting a transverse elastic modulus either 10 times smaller or 3 times larger than that of the substrate, respectively. As shown in FIG. 4C, these indentation simulations show that a SiC(0001) substrate coated by a stiff diamond-like film yields a force vs. indentation depth curve steeper than that of the bare SiC substrate, whereas a 5-L graphene film or a 2-L graphene film, which does not undergo any phase change, on SiC lead to a significant softening of the transverse mechanical response. These results are in good qualitative agreement with the experimental indentation curves reported in FIG. 1A, FIG. 1D and FIG. 1F and FIG. 2A, demonstrating that only an ultra-stiff 2-L film, considerably stiffer than graphene, can lead to the stiffening effect, compared to bare SiC, reported in FIG. 2A.

Conclusions

Sub-A resolution elastic indentation experiments, microhardness measurements, and conductive AFM investigations show that at room temperature, pressures of the order of 1-10 GPa can reversibly transform 2-L epitaxial graphene into a diamond-like ultra-stiff and ultra-hard phase. A SiC (0001) substrate coated with a two-layer epitaxial graphene film not only displays a stiffness similar to that of diamond but it also resists perforation by a diamond indenter at loads that can create plastic indents in bare SiC, one of the hardest materials known. All these properties are not found with graphene films thicker than 3-5 layers, or consisting of just the single buffer layer, proving the unique mechanical response of 2-L graphene on SiC(0001). DFT calculations demonstrate that the observed mechanical behavior under compression of 2-L graphene stems from its ability to undergo a structural $sp^2$-to-$sp^3$ transformation, and that such ability is hindered in 3-L or thicker films by unfavorable layer stacking configurations, whereas it is favored by the presence of a buckled buffer layer in contact with the reactive SiC(0001) substrate. DFT also shows that the resulting diamond-like film may exhibit an elastic modulus as large as 1 TPa, and that its formation is not precluded by the lack of chemical species to passivate and stabilize the outer film surface. The disclosed findings identify supported 2-L graphene as an interesting candidate for pressure-activated adaptive ultra-hard and ultra-thin coatings and for force-controlled dissipation switches. This disclosure also opens up new ways to investigate graphite-to-diamond phase transitions at room temperature in low dimensional systems. Finally this work suggests a new route to produce and pattern single layer diamond in graphene. For example, the diamond-like phase could be stabilized by combining local pressure with temperature, passivating gasses, or local heating, and applications could range from nanoelectronics to spintronics.

Methods

Growth and Characterization of Epitaxial Graphene Films on SiC

Epitaxial graphene films were grown on 4H—SiC on axis wafers by the confinement controlled sublimation method (W. A. De Heer, C. Berger, M. Ruan, M. Sprinkle, X. Li, Y. Hu, B. Zhang, J. Hankinson, E. Conrad, Large area and structured epitaxial graphene produced by confinement controlled sublimation of silicon carbide. *Proc. Natl. Acad. Sci.* 108, 16900-16905 (2011)). Additional details can be found in C. Berger, Z. Song, X. Li, X. Wu, N. Brown, C. Naud, D. Mayou, T. Li, J. Hass, A. N. Marchenkov, E. Conrad, P. N. First, W. De Heer, Electronic confinement and coherence in patterned epitaxial graphene. *Science* 312, 1191-1196 (2006) and in C. Berger, D. Deniz, J. Gigliotti, J. Palmer, J. Hankinson, Y. Hu, J.-P. Turmaud, R. Puybaret, A. Ougazzaden, A. Sidorov, Z. Jiang, W. A. d. Heer, in *Graphene growth on semiconductors*. (PanStanford, arXiv:1611.08937 2016). In FIG. 1D and FIG. 1F, the buffer layer and 5-L graphene were grown on the (0001)-face (Si-face) of SiC. In FIG. 1B, 10-L graphene was grown on the (000-1)-face (C-face) of 4H—SiC. In general, films with more than 10 layers were grown on the C-face. All the experiments reported here on the buffer layer and 2 L graphene were performed on samples grown on the (0001)-face (Si-face) of SiC. Transmission Electron Microscopy (TEM) (FIG. 2B), Kelvin Probe Force Microscopy, Scanning TEM and Raman spectroscopy measurements were performed to characterize the epitaxial graphene samples and probe the number of graphene layers.

MoNI Stiffness Measurements

A detailed description of the MoNI technique is reported in the SI, as well as in I. Palaci, S. Fedrigo, H. Brune, C. Klinke, M. Chen, E. Riedo, Radial elasticity of multiwalled carbon nanotubes. *Phys. Rev. Lett.* 94, 175502 (2005). Sub-Å vertical oscillations $\Delta z_{piezo}$ are applied at 1 kHz to the AFM tip via a piezoelectric stage rigidly attached to the AFM cantilever-tip system, and controlled by a Lock-in amplifier, while a constant normal force F: between the tip and the supported graphene films is maintained constant by the feedback loop of the AFM. An important feature of MoNI is that the tip is first brought into contact with the sample and pressed until a force of the order of $10^2$ nN is reached; then the tip is retracted (in about 10 s) from the surface while normal force variation $\Delta F_z$ at each fixed normal force $F_z$ are measured during the retraction. The integration of the measured $\Delta F_z/\Delta z_{piezo}$ at different normal loads $F_z$ allows us to acquire high-resolution force ($F_t$) indentation curves. MoNI experiments have been performed on standard samples such as ZnO single crystals and quartz to ensure the ability of MoNI to obtain reliable quantitative results. The typical error in force determination is $\Delta F_z$=0.5 nN which translates into an error in the indentation position of about $\Delta z$=0.003 nm, for the cantilever spring constant used in this disclosure $k_{lev}$=173 N/m. The estimated overall accuracy of the MoNI method is $\Delta z$=0.01 nm. The MoNI experiments have been repeated with the same AFM tip back and forth from the SiC sample to the different graphene samples, to ensure that the tip remains unchanged. About 60 MoNI complete measurements, at different times, locations and for different samples have been acquired and show consistent results. Different methods are used to determine tip radius and cantilever spring constant, typical values are respectively ~100 nm and 173 N/m.

Micro-Hardness Measurements

The micro-hardness experiments were performed with an AFM sapphire cantilever having a diamond indenter attached to it (Micro Star TD10780, spring constant 151 N/m, and estimated tip radius 100±50 nm). In a typical experiment, the sample is initially scanned with a set point force of 0.5-1.5 μN to record the initial topography and remove eventual organic residues from the surface. The indentation force is applied at the center of the scanned region by directly approaching the surface with a set point force of 12 μN and an approaching speed of approximately 5 μm/s. After indentation, the surface is scanned again with a lower set point force (less than 0.5 μN) to assess the presence of the residual indent. The hardness, H, is derived by using the following definition, H=F/A, where F is the maximum force applied with the indenter and A is the area of the residual indent determined by the analysis of the AFM topography image.

Conductive AFM Measurements

Conductive AFM were performed on 2-L graphene and 5-L graphene films with AFM probes purchased from Bruker (model: SCM-PTSI). The tip is made of doped Si with Pt coating on the apex to enhance its conductivity. The spring constant of the cantilever is 2.8 N/m. Electric current flows between the tip and a silver-paste electrode deposited close to the edge of the sample (~300 μm). At each normal force (varying from 0 nN up to 350 nN), a 50 nm×50 nm current AFM image was taken using a constant DC voltage of 3 mV. Then, the average current and standard deviation error are obtained from the current AFM images.

Computational Methods

Density functional theory calculations were carried out by using tools in the QUANTUM-Espresso package. Norm-conserving pseudopotentials were used for all atomic species, a conventional parametrization for the generalized gradient approximation of the exchange and correlation energy, a plane-wave energy cutoffs larger than 80 Ry, and a semi-empirical corrective scheme to account for London dispersion interactions.

Indentation simulations relied on the use of atomistic model structures and Hookean force fields. Cubic lattices with lattice constant of 2 Å were used to describe both substrate and 2D film. Substrate and 2D film are periodic in the xy-plane and finite in the perpendicular (z-) direction. In the xy-plane, substrate and 2D films include 40×40 cubic lattice sites, whereas in the perpendicular direction they include 15 layers for the substrate and 2 or 5 atomic layers to mimic 2D films with the elastic properties of 2-L or 5-L graphene, or a stiffer diamond-like film. The first (bottom)

layer of the substrate is held fixed during the indentation simulations. Each lattice site is connected to its $1^{st}$, $2^{nd}$, and $3^{rd}$ nearest neighbor sites via a harmonic spring with a stiffness k. Sites in the same xy-plane are connected through springs with constant $k_{xy}$, whereas sites belonging to different layers are connected by springs with constant $k_z$. Values of these spring constants were calibrated to reproduce a Young's modulus of about 0.45 TPa for an isotropic substrate, a modulus of 1.2 TPa for an isotropic stiff material, and moduli parallel and perpendicular to the xy-planes of about 50 GPa and 1.2 TPa, respectively, for an anisotropic material used to mimic multilayer graphene films.

To describe a spherical indenter and its interaction with the lattice sites lattice sites of the substrate/2D film, a spherical Fermi-Dirac-type potential energy function was used, with parameters such as to mimic a tip with a radius of 5 nm and an elastic modulus close to that of diamond.

Epitaxial Graphene on SiC (0001)

Epitaxial graphene (EG) films were grown on 4H—SiC on axis wafers by the confinement controlled sublimation method (H. Cynn, J. E. Klepeis, C. S. Yoo, D. A. Young, Osmium has the lowest experimentally determined compressibility. *Phys Rev Lett* 88, 135701 (2002); published online EpubApr 01 (10.1103/PhysRevLett.88.135701)). The wafers, purchased at CREE, are CMP polished on the growth face. Temperature and time were optimized to produce few graphene layers on the (000-1)-face (C-face) (2), or a single graphene layer on the (0001)-face (Si-face), around 1450° C. for 7 minutes and 1550° C. for 20 minutes, respectively. On the Si-face the first carbon layer is known as the buffer layer, and has a graphitic atomic structure but a semiconducting electronic structure due to its interaction with the (0001)-SiC surface termination. Quality and homogeneity of the samples were controlled by atomic force microscopy (topography, friction force and electrostatic force microscopy) and Raman spectroscopy. In FIG. 1F and FIG. 1D, the buffer layer and 5 L graphene were grown on the (0001)-face (Si-face) of SiC. In FIG. 1B, 10 L graphene was grown on the (000-1)-face (C-face) of SiC. In general, samples with more than 10 L are grown on the C-face. All the experiments reported here on the buffer layer and 2 L graphene were performed on samples grown on the (0001)-face (Si-face) of SiC.

Characterization of the Epitaxial Graphene Films

Figure 5A:
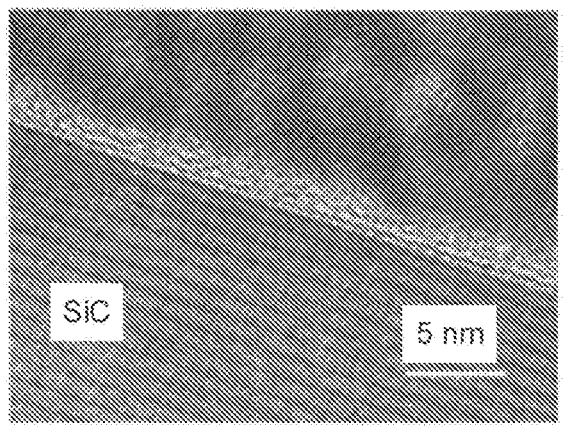
FIG. 5A is a TEM image of a 2-L epitaxial graphene on SiC(0001)
Figure 5B:
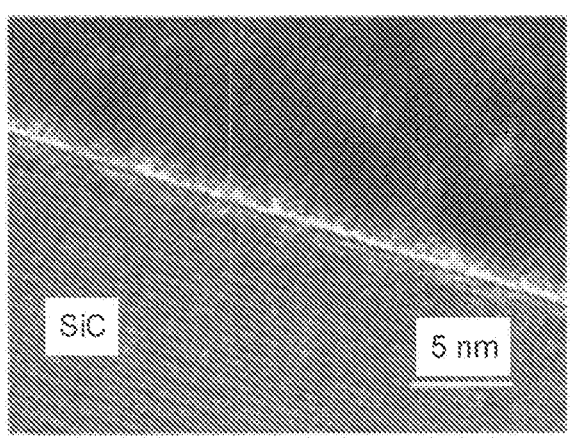
FIG. 5B is a TEM image of a single-buffer-layer graphene on SiC(0001)
Figure 6A:
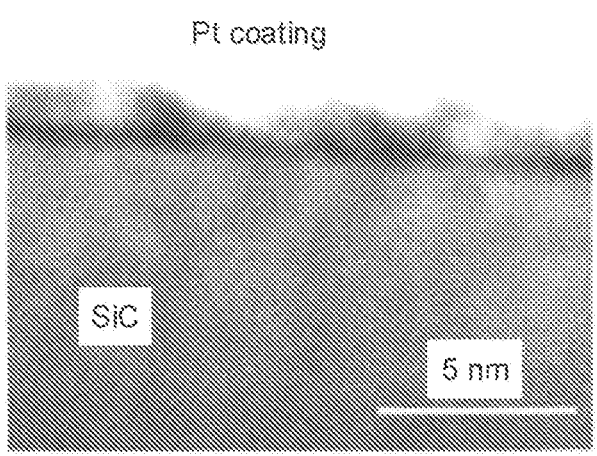
FIG. 6A is a TEM image of an epitaxial image of a buffer-first-layer with the region between SiC and the Pt coating corresponding the graphene layers.
Figure 6B:
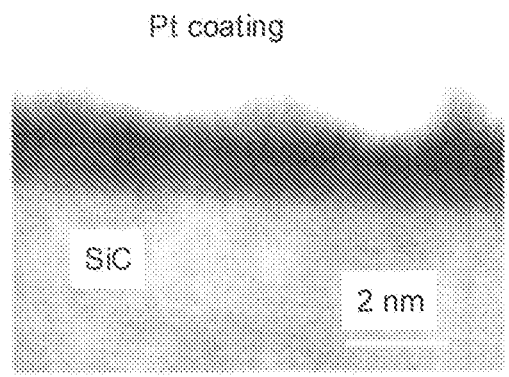
FIG. 6B is a TEM image of an epitaxial image of a 2-L graphene with the region between SiC and the Pt coating corresponding the graphene layers.

Transmission Electron Microscopy (TEM) (FIG. 2B, FIG. 5A and FIG. 5B), Kelvin Probe Force Microscopy (KPFM), Scanning TEM (STEM) (FIG. 6A and FIG. 6B), friction force microscopy and Raman Spectroscopy were used to probe the number of layers in the epitaxial graphene samples. KPFM is an atomic force microscopy (AFM) module that can measure the work function or surface potential difference between the metal-coated (usually Pt/Ir) probe and the sample surface. Previous studies have shown that the local work function of EG increases with increasing number of layers. Friction force microscopy is also used to identify the different number of layers and the presence of bare SiC on the surface.

The Modulated Nanoindentation (MoNI) Method

A detailed description of the modulated nanoindentation (MoNI) experimental technique can be found in F. Gorrini, M. Cazzanelli, N. Bazzanella, R. Edla, M. Gemmi, V. Cappello, J. David, C. Dorigoni, A. Bifone, A. Miotello, On the thermodynamic path enabling a room-temperature, laser-assisted graphite to nanodiamond transformation. *Scientific Reports* 6, (2016). The following describes only the key aspects of this experimental technique. MoNI measurements were carried out on a homemade system based on an Agilent PicoPlus AFM. Prior to MoNI experiments, a frequency sweep was carried out to find the resonance frequency, $f_{piezo}$, of the AFM piezo tube (not the cantilever resonance frequency). Then, the oscillation frequency f of the AFM tip (which is applied to the AFM probe via the piezoelectric stage rigidly attached to the AFM cantilever-tip system) was ensured to be significantly different and not close to the value of $f_{piezo}$. This allowed us to carry out MoNI measurements with small tip oscillations (about 0.1 Å) and shallow indentation depth (less than 1 Å). For all the MoNI measurements reported in this work, f=0.991 kHz. The oscillations were controlled by a Lock-in amplifier (Stanford Research Systems, SR830) and the normal force $F_z$ between the probe and sample was maintained constant by the feedback loop of the AFM.

In a MoNI measurement, the driving piezo-stage oscillation amplitude $\Delta z_{piezo}$ is fixed and equal to the sum of the cantilever bending and probe-sample normal deformation. Under such circumstance, the AFM cantilever and the probe-sample contact can be considered as two springs connected in series: the cantilever with spring constant $k_{lev}$ and the probe-sample contact with stiffness (or effective spring constant) $k_{cont}$. The force required to stretch these two springs in series with a total displacement $\Delta z_{piezo}$ is equal to the normal force variation $\Delta F_z$ which is caused by the piezo-stage oscillation. This allows one to obtain the total spring constant $k_{tot}$ at each normal load $F_z$ from the following relation:

$$\Delta F_z/\Delta z_{pizo}=k_{tot}(F_z)=(1/k_{lev}+1/k_{cont})^{-1} \qquad (2)$$

where $\Delta F_z$ is recorded at each $F_z$ and is much smaller than $F_z$. An important feature of these measurements (distinguishing MoNI from traditional nanoindentation technique) is that the probe is first approached with a force about $10^2$ nN to make a hard contact with the sample surface and then slowly retracted from the surface. Values of $\Delta F_z$ and total stiffness $k_{tot}$ at each fixed normal force $F_z$ are measured while retracting the AFM tip. The measurement of $\Delta F_z/\Delta z_{piezo}$ ($k_{tot}$) at different normal loads $F_z$ allows us to acquire the probe-sample contact stiffness $k_{cont}$ as a function of $F_z$ since $k_{lev}$ is just the cantilever spring constant, which can be measured independently. After measuring $$\frac{\Delta F_z}{\Delta z_{piezo}} = k_{tot},$$

$k_{cont}$ versus $F_z$ is integrated to obtain the $F_z$ vs. indentation depth curves from the following equation:

$$z_{indent}(F_z) = z_{indent}(F_{po}) \int_{F_{po}}^{F_z} \frac{dF_z}{k_{cont}(F_z)}. \qquad (3)$$

AFM Cantilever Spring Constant Measurement

The Sader method was used to determine the spring constant of the cantilever. Sader et al. demonstrated that the spring constant of a rectangle cantilever is:

$$k=0.1906\ \rho_f Q_f \Gamma_i(\omega_f)\omega_f^2 \qquad (4)$$

$\rho_f$ is the density of the surrounding fluid (in this case, air), b and L are the width and length of the cantilever, $Q_f$ is the quality factor of the cantilever and $\omega_f$ is the fundamental mode resonance frequency. $\Gamma_i$ is the imaginary component of the hydrodynamic function which only depends on the Reynolds number:

$$Re = \rho_f \omega_f b^2 / 4\eta \quad (5)$$

$\eta$ is the viscosity of air and is independent of the cantilever.

Figure 7:
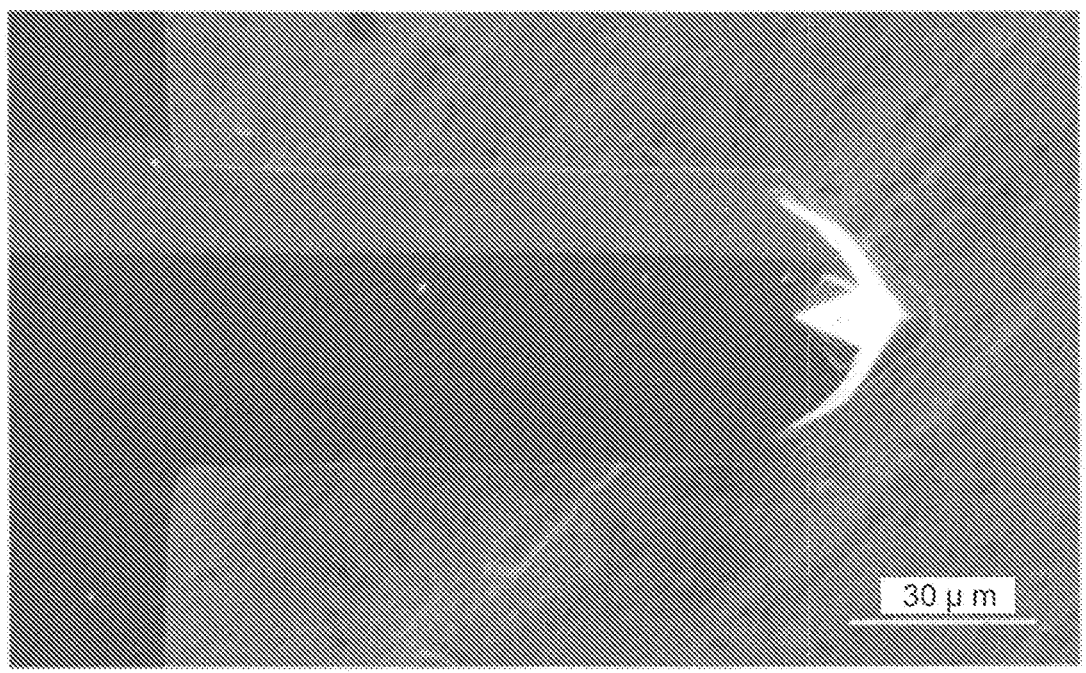
FIG. 7 shows a Scanning Electron Microscopy (SEM) image of an AFM probe used for MoNI (TAP525A, purchased from Bruker)
Figure 8A:
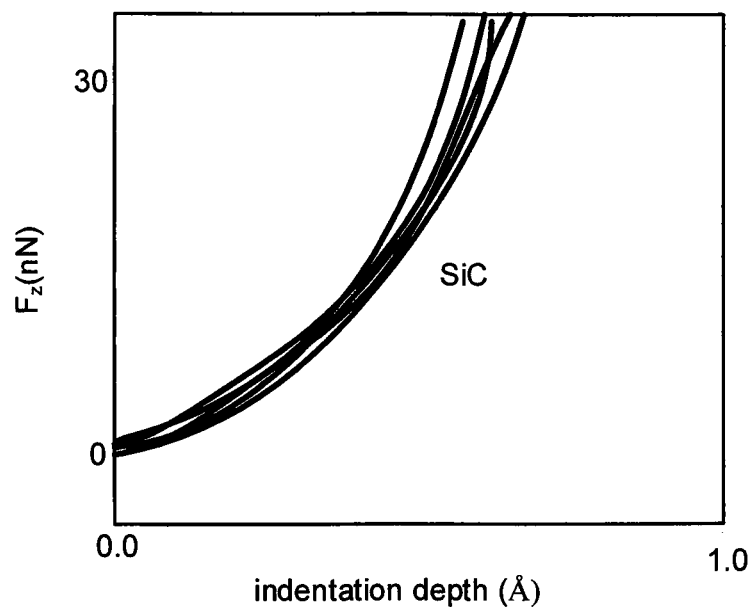
FIG. 8A is a graph showing MoNI curves on SiC.
Figure 8B:
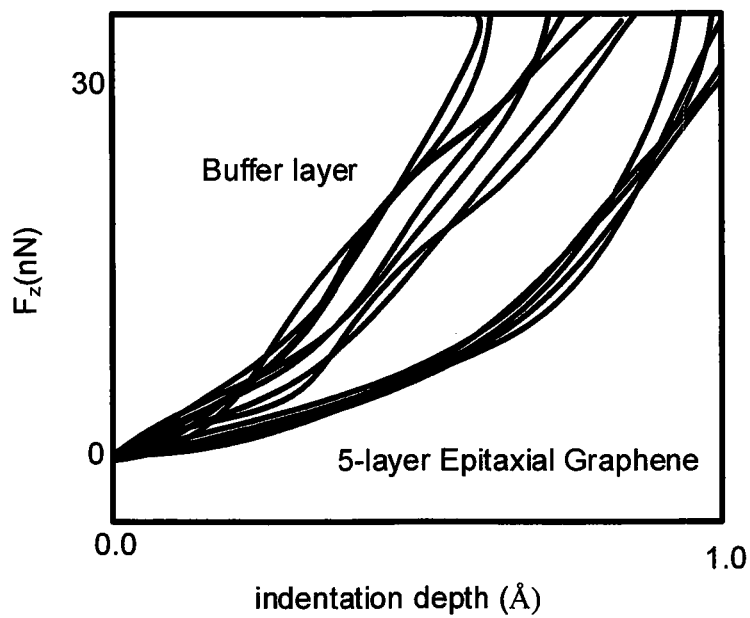
FIG. 8B is a graph showing MoNI curves on buffer layer and 5-L epitaxial graphene.
Figure 9:
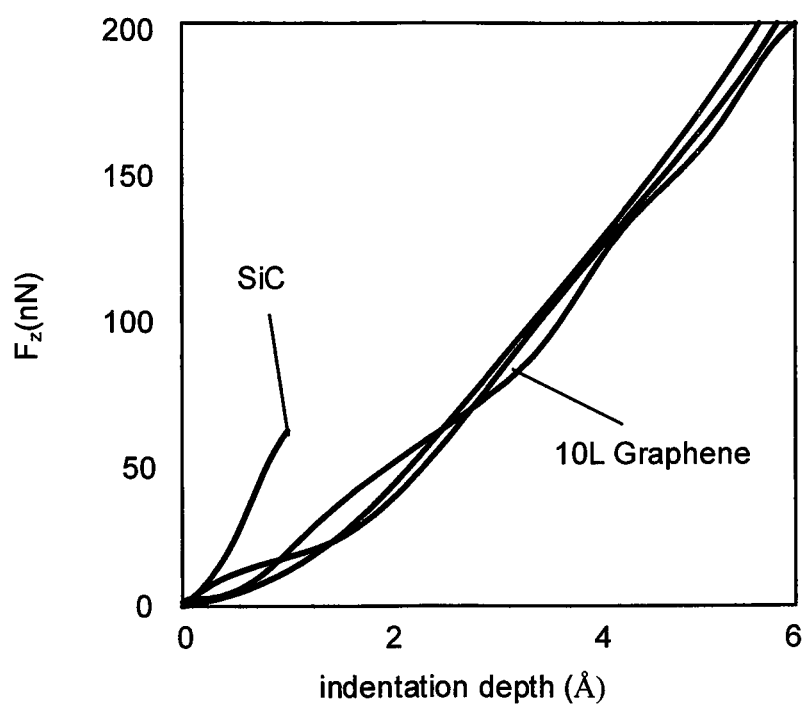
FIG. 9 is a graph of MoNI curves on SiC and 10 L epitaxial graphene.

FIG. 7 shows a Scanning Electron Microscopy (SEM) image of an AFM probe used for MoNI (TAP525A, purchased from Bruker). The dimension of the cantilever can be easily obtained, here we have b=51.4 L=118.0 μm. The resonance frequency and Quality factor of the cantilever are 525 kHz and 890, respectively. For air we use $\rho_f$=1.18 kg/m$^3$, $\eta$=1.86×10$^{-5}$ kg·m·s$^{-1}$. The above parameters were used in Eq. (5) to get Re=136. Plug the calculated Reynolds number into the hydrodynamic function $\Gamma(\omega_f)$ the imaginary part $\Gamma_i$=0.255 is obtained. Finally the parameters were used in Eq. (4) and obtain k=173 N/m.

Tip Radius Measurement and Tip Stability

Two methods are usually employed to measure the AFM tip radius. The first method is by SEM characterization. The other method is so-called "reference material method". MoNI was applied on a well-known isotropic material like SiC and fused Quartz of which the Young's moduli are known, then the indentation curves were fitted with R as the only free fitting parameter. Both methods were used to ensure consistency of the results, and a typical value for R is about 100 nm. To ensure that the tip is not changed or damaged during a set of measurements, SiC and fused Quartz was always used as reference samples to measure before and after each set of measurements. If the reference samples cannot reproduce the "standard" indentation curves, the tip is discarded as well as the previous measurements. This disclosure only compares set of measurements taken with the same tip.

Reproducibility and Error Analysis of Indentation Curves

The indentation curves are acquired one after the other one in different locations of the different samples for several consecutive hours. However, very importantly, each indentation curve ($k_{tot}$ vs. $F_z$) is acquired in 10-15 seconds, therefore in each curve we have a drift in the normal force $F_z$ from the beginning of the indentation acquisition to the end of the individual curve acquisition of only $\Delta F_z$=0.2 nN, which is within the experimental error of the normal force reported in the main manuscript (0.5 nN). This error in the normal force translates into an error in the indentation position of about $\Delta z$=0.003 nm, for the cantilever spring constant used in this disclosure $k_{lev}$=173 N/m. This error is included in the limit of accuracy of the MoNI method which is $\Delta z$=0.01 nm. Furthermore, some sources of errors and noise including the drift of the piezo-tube are fully compensated by the fact that the feedback loop is on during the indentation experiments and differential forces were acquired by lock-in detection.

The curves for the same material and conditions are reproducible, from December 2014 until at least October 2017, the experiments shown in this disclosure were continuously repeated and the results are always consistent. On average, about 60 measurements were taken for each sample (of SiC, buffer layer, 2-layer graphene, 5 L graphene, and 10 L graphene), changing area on a given sample and probing different samples of the same kind. All the measurements in which the tip was damaged or changed (see "tip stability" in previous section) were discarded, and only complete series of experiments when the same tip is used for the five different materials were considered. Variations in different locations of the same sample are mainly attributed to inhomogeneity of the samples' surface. For this reason, indentation curves were recorded in various different regions. In all cases and samples considered in this study, the indentation curves were reproducible as shown in FIG. 2A, and FIG. 8A and FIG. 8B and FIG. 9. For two-layer graphene and the buffer layer, we noticed a larger spread of the data (see e.g. FIG. 2A, FIG. 8A and FIG. 8B). This spread of curves can be attributed to inhomogeneities in the local number of layers or defects.

Deep Indentation on 10-L Graphene

The graphene-diamane phase transition has only been observed in 2-L graphene but not on thicker graphene films such as 5-L and 10-L. In FIGS. 1A to 1F, the indentation depth is 0.8 Å for all the graphene indentation curves. However, MoNI was also performed with larger indentations, for example in FIG. 9 an indentation of 6 Å in 10-L graphene is shown.

Micro-Hardness Measurements

The micro-hardness measurements were conducted on SiC, 2-L epitaxial graphene and 5-L epitaxial graphene in various areas of the samples and in several sequences to guarantee the reproducibility of the experiments and the stability of the indenter. Two diamond indenters of the same type (Micro Star) were used. The data was obtained with the diamond indenter Micro Star TD26913, spring constant 152 N/m and estimated tip radius 100±50 nm from SEM. In this set of experiments, the indentation force is applied using the ramp function of the Multimode AFM (from Bruker) with a maximum intensity of 30 μN (ramping speed 20 nm/s). To increase penetration of the indenter, the force is applied three times in the same region on the sample. Experiments were conducted in close succession on SiC, 2 L graphene, and again on the SiC sample. Holes of variable depth (250-800 pm) are found on SiC in all recorded conditions (totally 12 measurements), while residual holes can be detected on 2 L graphene surfaces in only 1 out of 15 of the tested positions. In a typical experiment, the sample is initially scanned with a set point force of 0.5-1.5 μN to record the initial topography and remove eventual organic residues from the surface, as a consequence we noticed that after several microhardness experiments the indenter is contaminated with residues as observed through scanning electron microscopy (SEM). These residues consistently reduce the ability of the indenter to penetrate the sample, so the indenter needs to be cleaned or changed to continue the experiments.

Current AFM Measurements

Figure 10A:
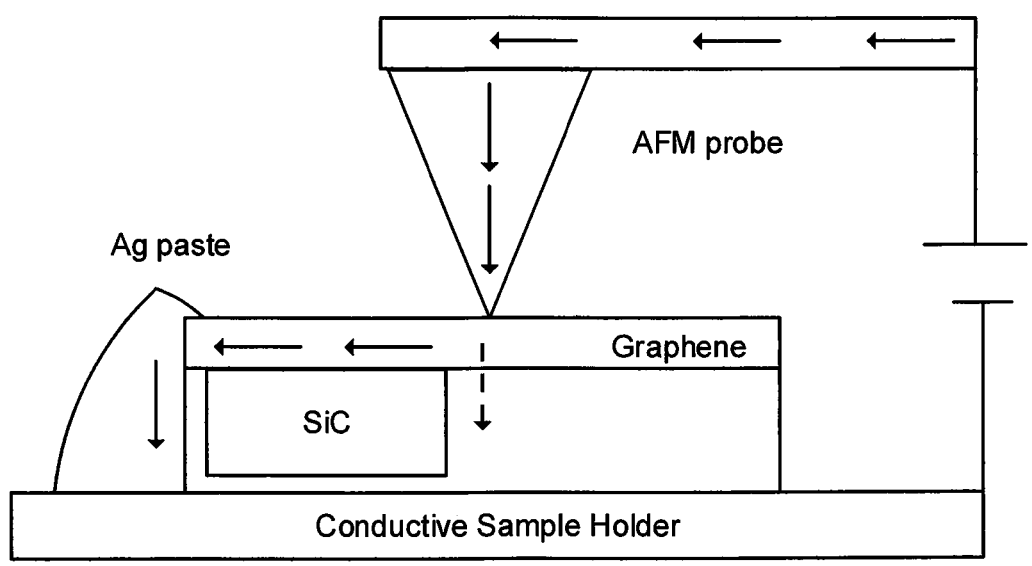
FIG. 10A shows an experimental setup for C-AFM performed by electrically connecting the graphene surface with the bottom electrode through Silver paste deposited on the sample edge (note that SiC is insulating)
Figure 10B:
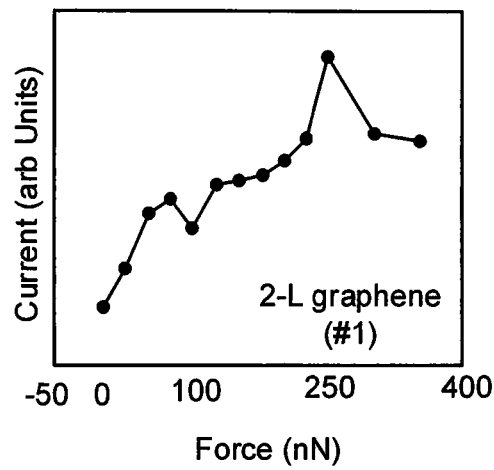
FIG. 10B is a graph showing current AFM measurement for a 2-L graphene sample.
Figure 10C:
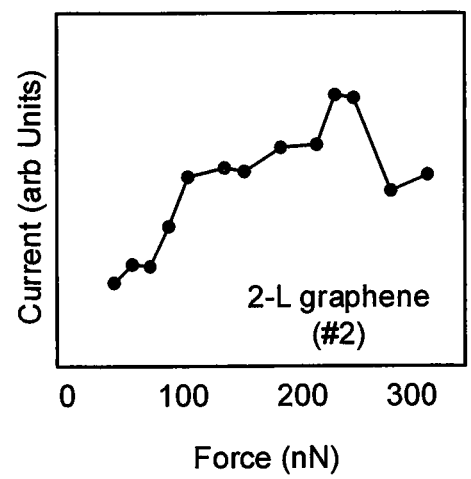
FIG. 10C is a graph showing current AFM measurement for a 5-L graphene sample.
Figure 10D:
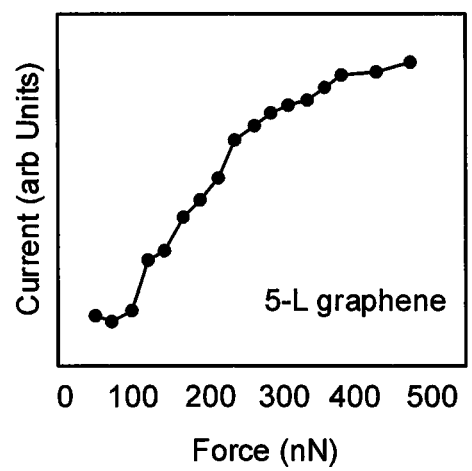
FIG. 10D is a graph showing current AFM measurement with a voltage of 3 mV.

Current AFM (C-AFM) was performed on 2-L graphene and 5-L graphene samples with metallic AFM probes purchased from Bruker (model: SCM-PTSI). The tips used for C-AFM measurement are made of doped Si with Pt coating on the apex to enhance the conductivity. The spring constant of the cantilever is 2.8 N/m. The measurements were performed close to the sample edge where some Silver paste was deposited to electrically connect the graphene surface with the bottom electrode, since the SiC substrate is insulating, as shown in FIG. 10A. For each normal load (varying from 0 nN to 350 nN with a force interval of about 30 nN), a 50 nm×50 nm C-AFM image is taken with a constant DC voltage of 3 mV applied between the metallic AFM tip and the bottom electrode. The average current is calculated from each C-AFM image. Notice that the absolute values of the current values may significantly vary due to many factors such as the quality of the silver paste contact, thickness of the film, the surface current path, and the distance between the measured region and the Silver paste. However, a drop in current around 270 nN was reproducibly observed (with the same cantilever) for 2-L graphene. See FIG. 10B, FIG. 10C and FIG. 10D.

Density Functional Theory Calculations

Density functional theory (DFT) calculations were carried out by using the QUANTUM-Espresso software. Norm-conserving pseudopotentials were used for all atomic species, the generalized gradient approximation for the exchange and correlation energy proposed by Perdew, Burke and Ernzerhof (PBE), plane-wave energy-cutoffs larger than 80 Ry, and the semi-empirical corrective scheme proposed by Grimme to account for London dispersion interactions. This periodic DFT scheme reproduces well structural and elastic properties of SiC, diamond, and graphene. In particular, we obtained the following values of lattice constants and Young's moduli: 3.6 Å and 1.1 TPa for diamond, a=3.17 Å, c=10.4 Å and 490 GPa for the 4H phase of SiC, and a lattice parameter of 2.49 Å for graphene. In this work, most of the periodic DFT calculations were carried out to describe 2D films. In these cases, supercells including a vacuum region of about 12 Å were used.

H-Terminated Bilayer Carbon Films with a Diamond-Like Structure

Figure 11:
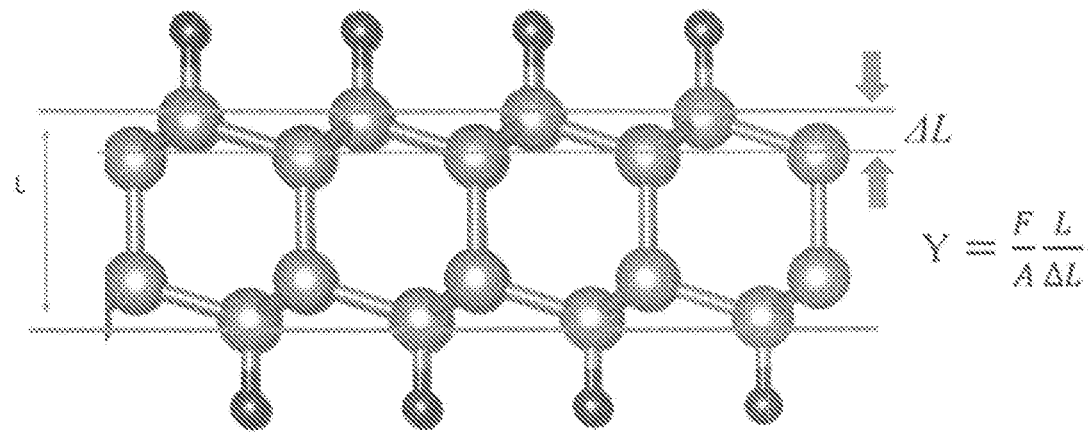
FIG. 11 is a ball and stick image of a H-terminated carbon film with a diamond-like structure; solid lines, arrows, and formula are shown to illustrate the key aspects of the method used to calculate the Young modulus of these types of films.
Figure 12:
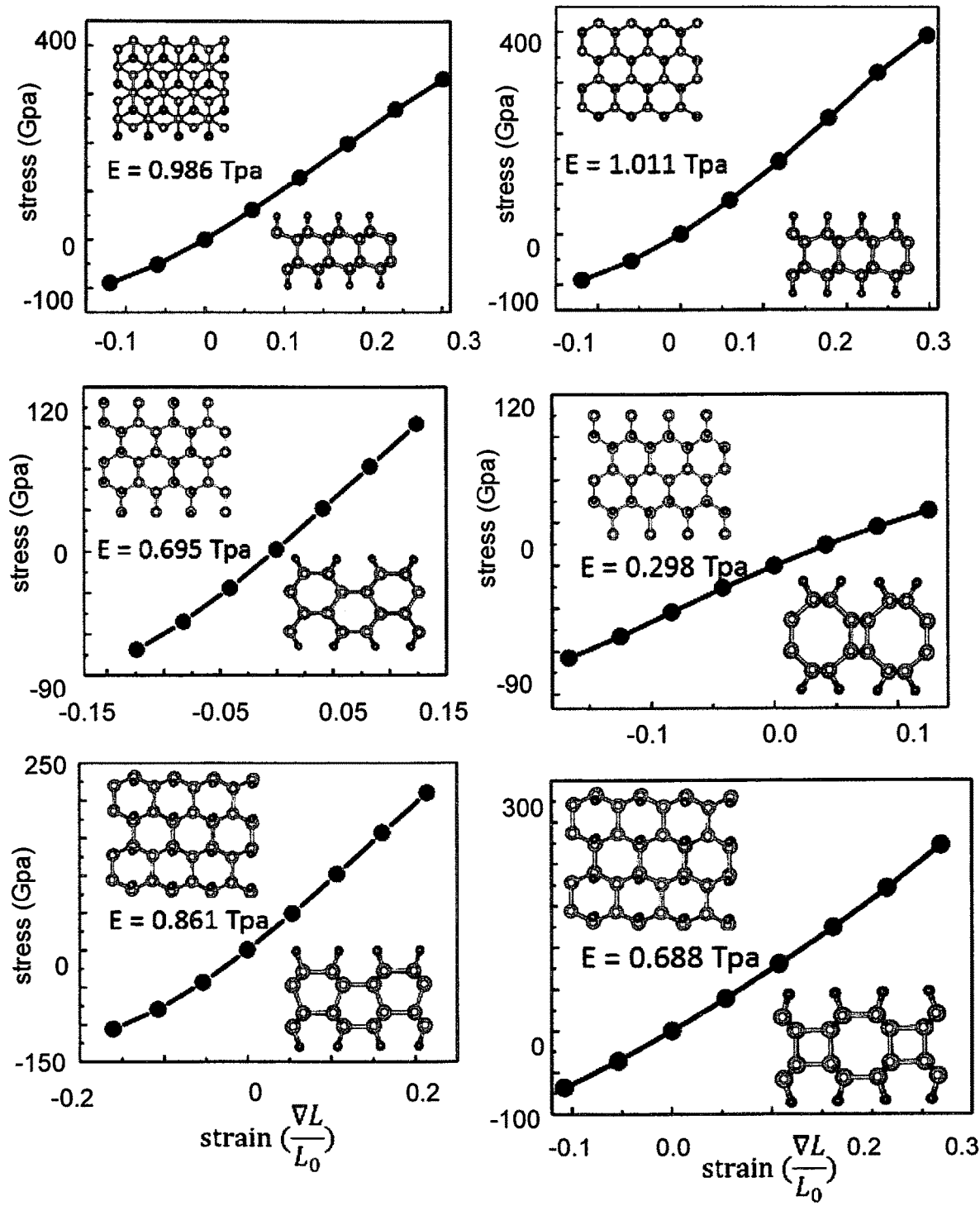
FIG. 12 shows various stress vs. strain curves of H-terminated diamond-like bilayer films calculated by DFT. Insets, top and side views of the carbon films; C and H atoms are shown in gray and black colors, respectively. The Young's modulus of each film is also shown in each panel.

DFT was used to model the structure and calculate the Young's modulus of bilayer carbon films with all the C atoms forming $sp^3$ bonds and dangling bonds saturated with H atoms. To calculate the Young's modulus of a H-terminated bilayer diamond-like film, we used the following method. Constrained DFT optimization calculations were carried out in which the z-coordinates (perpendicular to the 2D layers/film) of the C atoms bonded to H were kept fixed and constrained to lie on a same plane. This strategy was used to control the strain in the carbon film along the direction perpendicular to the carbon planes, and the constrained DFT calculations were used to optimize ionic positions and cell parameters and compute the value of the stress across the vertical direction of the film; this quantity was calculated as total force on the C atoms constrained to lie on the same plane divided by the area of the plane. In these DFT calculations, the carbon film was allowed to relieve the stress in the direction parallel to the film. The Young's modulus was thus calculated simply as stress/strain (FIG. 11). A schematic of this method is shown in FIG. 11, whereas ball-and-stick images, stress vs. strain curves, and Young's moduli for a set of six diamond-like carbon films exhibiting different conformations are shown in FIG. 12. As shown in FIG. 12, bilayer carbon films exhibiting a diamond-like structure exhibit a Young's modulus ranging from 0.3 TPa up to values of 1.01 TPa, close to the calculated value for bulk diamond.

Figure 13:
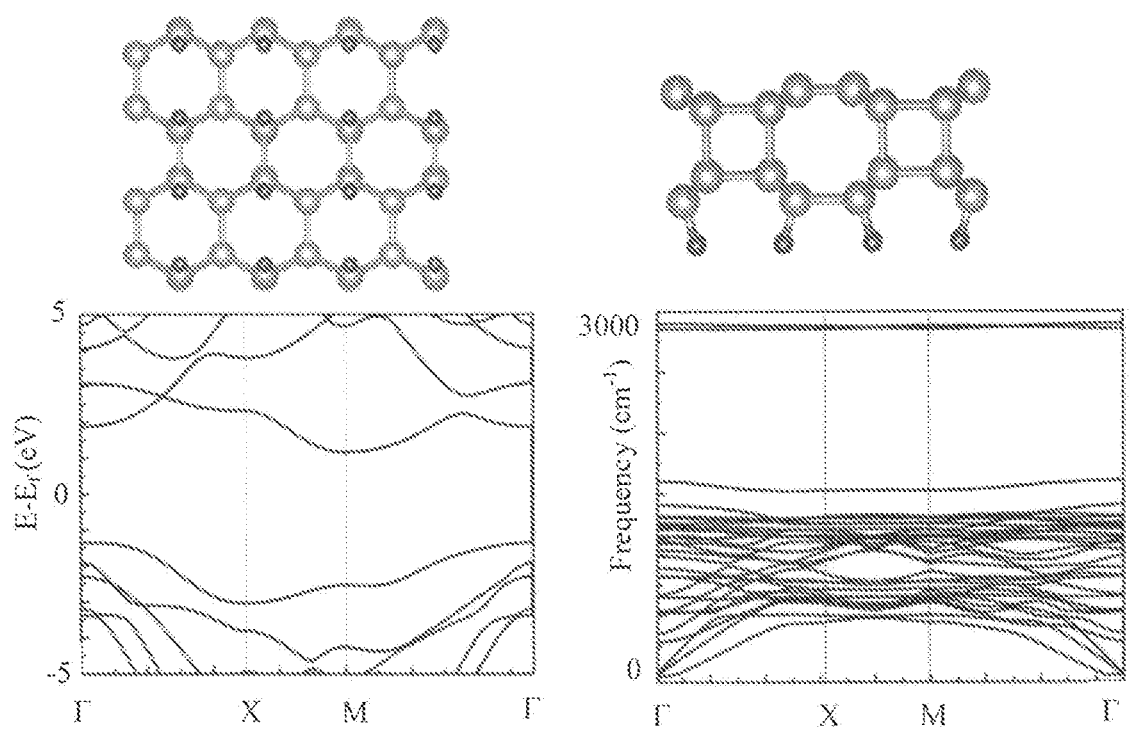
FIG. 13 depicts bottom (left) and side (right) views of a bilayer carbon film with a diamond-like structure forming bonds with H on only one surface termination. The bottom panels show electronic band structure (left panel) and phonon dispersion curves (right panel) of the film obtained by DFT calculations.

DFT calculations were also carried out to optimize the structure and calculate electronic energy bands and phonon dispersion curves of two bilayer carbon films with a diamond-like structure and dangling bonds terminated by H on only one of the two surfaces. These two films were obtained from those shown in two bottom panels of FIG. 12, by removing one layer of H atoms and by carrying out a full DFT structural optimization. In both cases, the half-terminated bilayer carbon films are both energetically and chemically stable: the phonon dispersion curves are devoid of negative frequencies, and the electronic band structure shows that the edges of the valence and conduction bands are separated by an energy gap of about 2 eV and devoid of any defect surface state (FIG. 13). These results show that indentation of a bilayer graphene film may lead to the formation of diamond-like film that does not require any surface passivation, and therefore that it can be formed under compression by a chemically inert AFM tip in an inert environment.

DFT Modeling of the Indentation Process: Role of Layer Stacking Configuration and Buffer-Layer/SiC Interface DFT calculations were carried out to simulate the indentation process of a graphene film in contact with ad hoc models of both the SiC(0001) substrate and AFM tip. In particular, both substrate and tip were described by using a single SiC(0001) plane, with C atoms saturated by H atoms and the Si-face in contact with and sandwiching a bi-, tri-, or tetra-layer graphene film. These types of model structures were used to simulate the indentation process and investigate the role played by both the substrate/film interface and layer stacking pattern on the phase transformation of a graphitic-like film into a diamond-like carbon film. To this end, in the case of a bi-layer graphene film we considered three distinct interfacial bonding patterns between buffer layer and Si-face (see FIG. 14A, FIG. 14B, FIG. 14C, FIG. 15), and in the case of tri- and tetra-layer films, we considered several selected stacking patterns (FIG. 16A). In all cases, the indentation process was mimicked by carrying out DFT structural-optimization calculations for a sequence of model structures with an increasingly smaller distance between the two mirroring SiC—H layers. In each of these calculations, the C atoms belonging to the SiC—H layers were kept fixed during the DFT optimization calculation; lattice parameters were also kept fixed in these calculations. The model structures used in these calculations have the advantage of being symmetric and computationally affordable, and they also have the disadvantage of modeling a graphene film in contact with two reactive surfaces. The results of the DFT calculations shown in FIG. 13 demonstrate that in case of a bilayer film, this phase transformation can occur (under compression) regardless of the presence of adsorbates or a reactive surface to chemically compensate the carbon layer in contact with the AFM tip.

Figure 15:
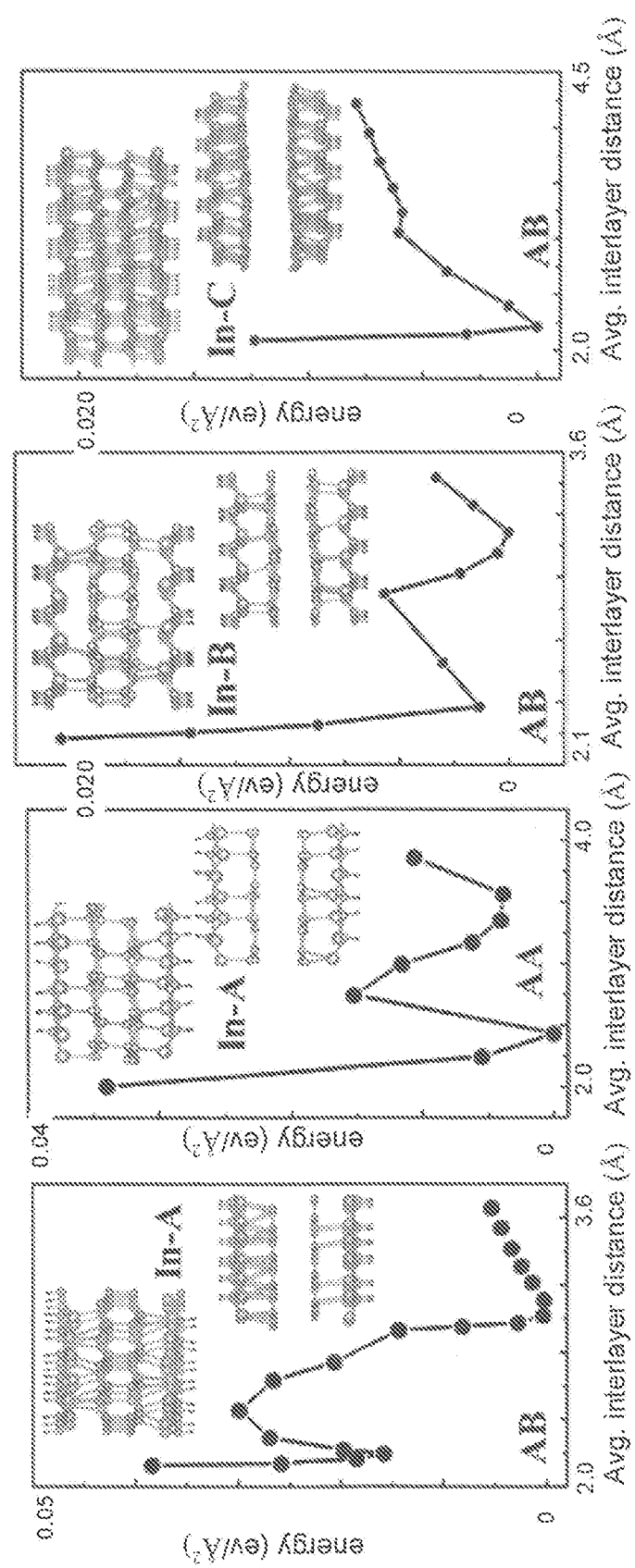
FIG. 15 shows several graphs of energy per unit area of a bilayer carbon film sandwiched between two mirroring SiC—H layers. Energy values are referred to the lowest one in each set of values and are plotted vs. the average distance between the carbon layers in contact with the Si-face of the SiC—H layers. The staking configuration of the two graphene layer is shown in the bottom-left corner of each panel, whereas interfacial structure between SiC—H layer and graphene is indicated in the center of each panel. The ball-and-stick images in the insets show the bilayer graphene film sandwiched between the two Si-faces, and the diamond-like films resulting by reducing the distance between the SiC—H layers used to mimic both substrate and tip.

The DFT calculations show that the interfacial structure between buffer layer and Si-face of a SiC(0001) substrate has a strong influence on the energy cost and hence transition pressure associated with the (presumably first-order) phase transformation from a graphitic- to diamond-like conformation of a bilayer carbon film (FIG. 15). In particular, these calculations show that the energy cost associated with the homogeneous transformation from a bilayer graphene film (sandwiched between to Si-termination of a SiC(0001) substrate) to a diamond-like film decreases for decreasing the lattice mismatch between the buffer layer and SiC(0001) surface (FIG. 14). The homogeneous phase transition may become barrier-less if mechanisms to saturate the dangling bonds are present not only at the interface with SiC but also on the surface layer exposed to air and in contact with the AFM tip (FIG. 15).

Figure 16:
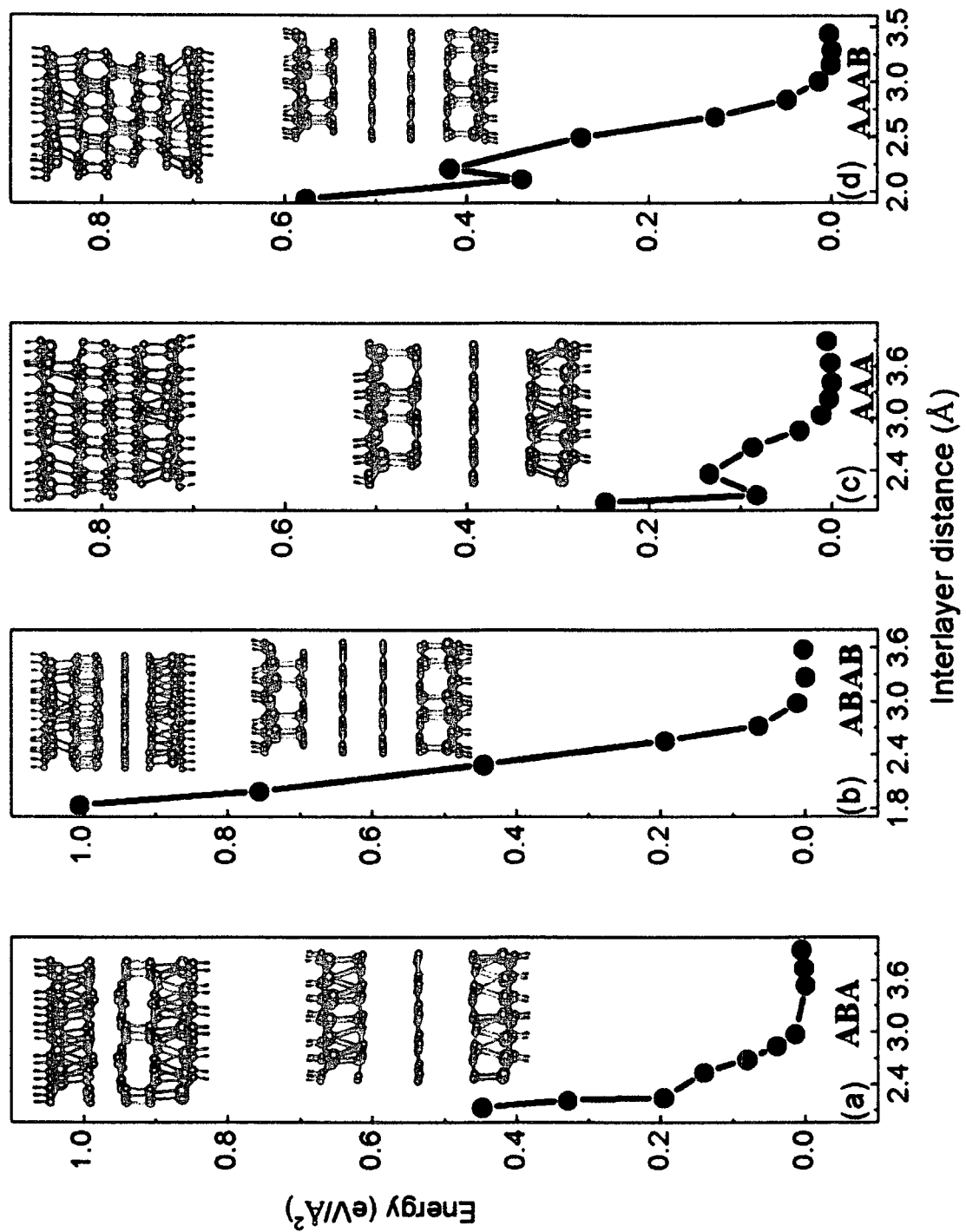
FIG. 16 shows several graphs of energy per unit area of [(a) and (c)] trilayer and [(b) and (d)] tetralayer carbon film sandwiched between two mirroring SiC—H layers. DFT calculations were started out by considering graphene layers stacked as specified in the panels and by using supercells based on the interface structure Inf-A; see caption of FIG. 13. The ball-and-stick images shown as insets show graphene films and the carbon film resulting by reducing the distance between the SiC—H layers.

The DFT calculations show also that the stacking pattern in multilayer graphene plays an important role in the pressure-induced phase transformation of a graphitic-like film to a diamond-like film structure (FIG. 16). Recent Angle Resolved Photoemission (ARPES) experiments of epitaxial multilayer graphene have shown that graphene layers grown on either the C-face or Si-face of hexagonal SiC exhibit a Bernal (AB) stacking pattern. This finding suggests that, similarly to what happens in bulk graphite, the phase transformation from a graphitic-like to a diamond-like structure is hindered by the stacking structure present the multilayer films.

Figure 17:
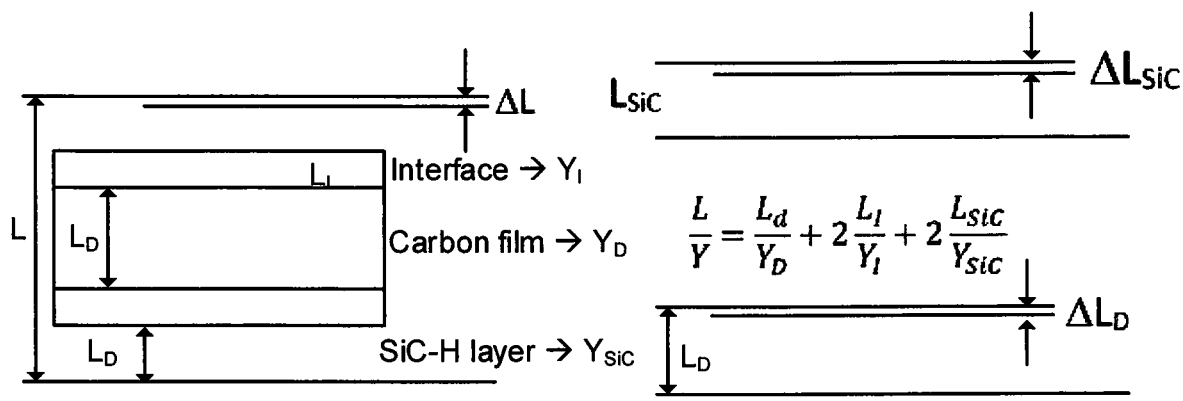
FIG. 17 is a schematic of model structure and method used to estimate the contribution to the Young modulus of a diamond-like film on SiC arising from the interfacial bonds between buffer layer and the Si-face of SiC.

We used the model structure of the bilayer diamond-like film shown in top-left corner of the left-most panel FIG. 15 and the method based on constrained DFT calculations to estimate the Young's modules associated with the interfacial bonds between the carbon film and the Si-face of SiC(0001). As shown in FIG. 17, such a model structure consists of a bilayer diamond-like film (central region, in blue-gray) sandwiched by two opposing terminal C—Si layers of a SiC(0001) substrate (yellow regions); the C atoms of the SiC layers are saturated by H atoms, whereas the Si atoms are in contact with the carbon film. Thus, the DFT-based method was used to calculate the Young's moduli of the layered inhomogeneous model structure (Y), and separately, also the moduli of the (H-terminated) carbon film ($Y_D$) and SiC—H layer ($Y_{SiC}$) forming the inhomogeneous layered film.

Figure 18:
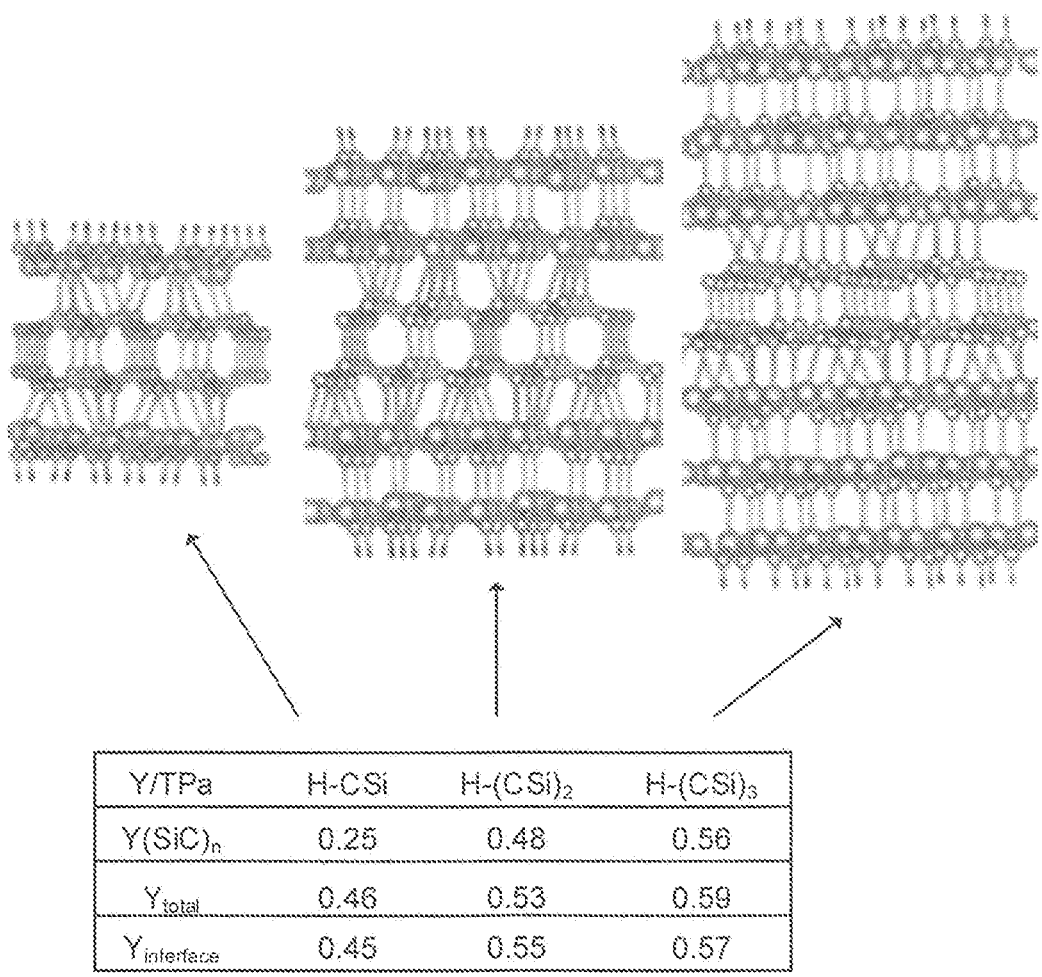
FIG. 18 shows ball-and-stick images of a 2-L diamond-like film sandwiched between mirroring slab models of a SiC(0001) substrate, consisting of one (left), two (center), and three (right) SiC(0001) layers, with the last layer of C atoms saturated by H atoms, and the top Si-face interacting with the carbon film. The table reports the transverse elastic moduli computed by DFT for the total model structure ($Y_{total}$), the slab model used to mimic the SiC(0001) substrate ($Y_{(SiC)n}$), and the interfacial layer between substrate and film ($Y_{Interface}$).

Elastic moduli and thicknesses of entire model structures and its layered components are related to each other through the equation shown FIG. 17 (which is derived by assuming equal stress across the direction perpendicular to the layers). Using this equation and the values for $Y_{SiC}$ and $Y_D$ derived from independent DFT calculations (equal to 0.25 TPa and 0.84 TPa, respectively; $L_{SiC}$=0.68 Å and $L_D$=2.57 Å), we found a value for the Young modulus of the interfacial region between the carbon film and SiC, $Y_I$, equal to 0.45 TPa. This value is close to the value for bulk SiC, thereby confirming that the interface is as stiff as the substrate and that the system diamond-film on SiC can indeed be thought as a stiff layer with an elastic modulus of up to 1 TPa in contact with a substrate with elastic modulus of about 0.45-0.49 TPa. Similar calculations, carried out using model structures of a diamond-like film sandwiched by more realistic representations of the SiC(0001) substrate (FIG. 18), show that the elastic modulus associate to the interfacial layer of bonds between substrate and carbon film may reach a value of about 0.57 TPa.

Atomistic Simulations of Indentation Curves Based on a Hookean Force Field

DFT calculations show that, upon compression, a bilayer graphene film can transform into a diamond-like film with a Young's modulus of up to 1 TPa in contact with the Si-face of a SiC(0001) substrate. The interfacial region between carbon film and substrate consists of a thin layer of bonds whose vertical mechanical strength is comparable to that of bulk 4H—SiC, whereas the surface of the diamond-like film consists of either chemically inert regions exposing for instance a dimeric C—C reconstruction as shown in FIG. 13, or regions with dangling bonds that may or may not be passivated by H or OH species. Although the fine structural features of this diamond-like bilayer film on SiC formed upon compression remain unknown (as they are difficult to be probed or predicted), we can nonetheless address the question of what might be the transverse mechanical response to a spherical indenter of a hard ultra-thin film on a softer substrate. To this end, and to circumvent the limitations of continuum elasticity theory, we devised a classical scheme based on atomistic model structures and a Hookean force field to describe the mechanical response of a surface coated with a sub-nanometer-sized hard film indented by a spherical tip.

In detail, we used a cubic lattice with lattice constant of 2 Å to describe both substrate and 2D film. Substrate and 2D film are periodic in the xy-plane and finite in the perpendicular (z−) direction. In the present work, we considered substrates and 2D films of 40×40 cubic lattice sites in the periodic xy-plane, whereas in the perpendicular direction, the substrate included 15 layers (the z-coordinates of the sites belonging to the first, bottom layer were kept fixed), whereas the supported 2D film included 2 or 5 layers. Each lattice site is linked to its $1^{st}$, $2^{nd}$, and $3^{rd}$ nearest neighbor sites through a harmonic spring. Sites in the same xy-plane are connected through springs with spring constant $k_{xy}$, whereas sites belonging to different xy-planes are connected by springs with constant $k_z$ (FIG. S16). Values of these spring constants were calibrated to reproduce a Young's modulus of about 0.45 TPa for the isotropic substrate, a modulus of 1.2 TPa for an isotropic stiff material, and moduli parallel and perpendicular to the xy-planes of about 50 GPa and 1.2 TPa, respectively, for an anisotropic material used to mimic multilayer graphene films. To model the interaction between a spherical indenter and lattice sites of the substrate/2D film, we used the following spherical Fermi-Dirac potential energy function:

$$U(\vec{r}, \vec{r}_l, R) = \frac{\varepsilon}{e^{\frac{|\vec{r}_l - \vec{r}| - R}{\Delta}} + 1} \quad (6)$$

where $\vec{r}$ is the position of the spherical-tip center, R is its radius, $\vec{r}_l$ is an arbitrary lattice site of the substrate and/or 2D film, and ε and Δ are parameters controlling stiffness and spatial extension of the repulsive contact. In particular, a spherical tip with a radius R equal to 5 nm, and values for ε and Δ equal to $10^3$ eV and 0.1 Å, respectively, was used.

In the indentation simulations, for each fixed position of the spherical tip, the positions of the lattice sites are optimized by using a damped molecular dynamic approach until forces and total kinetic energy are below a very small threshold value. Force versus indentation depth curves were constructed by taking the equilibrium value of the total force acting on the fixed tip (the bottom layer of the substrate is fixed), and by defining the indentation depth as the largest vertical deviation of the lattice sites belonging to the top surface layer. The overall scheme allows to go beyond continuum elasticity theory (which is inappropriate to describe the mechanical response of an ultra-thin film supported by a softer substrate) and calculate force vs. indentation depth curves to be compared to those obtained from MoNI experiments.

Figure 19:
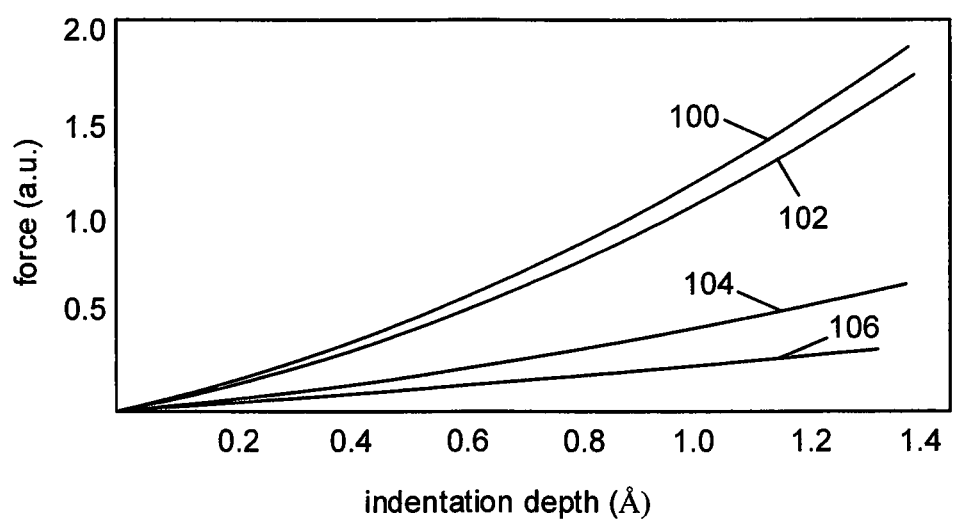
FIG. 19 shows force vs. indentation depth curves obtained by applying classical simulation scheme to the case of (line 102) a bare substrate with Young's modulus of 0.45 TPa, and the same substrate coated by a film exhibiting the elastic properties of (line 100) a 2-L diamond-like film, a (line 104) 2-L graphene film, and (line 106) a 5-L graphene film. Circles show results obtained from simulations, whereas the solid line show interpolations based on the Hertz model.

FIG. 19 shows a section of the force vs. indentation depth curves obtained by using a simulation scheme based on atomistic models and Hookean force fields. The curves reaching indentation depths of 3-4 Å. The computed values of force vs. indentation depth can be interpolated by using the following Hertz law (FIG. 19), describing the elastic contact between a spherical object and a semi-infinite solid:

$$F = \frac{4}{3} E^* \sqrt{R} z^{\frac{3}{2}} \quad (7)$$

where F is the force applied by the tip, z is the indentation depth, R is the radius of the tip, and E* is an effective elastic modulus, related to the elastic properties of tip and substrate as follows:

$$\frac{1}{E^*} = \frac{1-v^2}{E} + \frac{1}{E_{tip}} \quad (8)$$

where E and ν are the Young's modulus and Poisson ratio of the substrate, and $E_{tip}$ is the elastic modulus of a tip (with Poisson ratio equal to zero). Using these equations and the force vs. indentation curve obtained for the bare substrate (having a Young's modulus of 0.45 TPa and Poisson ratio equal to 0.51), we can estimate the elastic modulus of the repulsive spherical tip used in the disclosed indentation simulations, finding a value of about 1 TPa. A Hertz law can be also used to interpolate the force vs. indentation depth curves obtained for a substrate coated by a 2D film (FIG. 19). The fits shown in FIG. 19 show that, whereas the curves for a soft 2D film (mimicking multilayer graphene on SiC) follow closely a Hertzian behavior, the curve for a stiff 2-L diamond-like film on the softer substrate exhibits significant deviations from this law at indentation depths smaller than 1 Å. Deviations from a Hertz behavior, and a steeper curve for a 2-L diamond-like film are also observed experimentally.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A composition of matter comprising:
   a silicon carbide substrate having a surface; and
   an ultra-hard diamond-like carbon film, formed from compressed graphene, disposed on the surface, wherein the ultra-hard diamond-like carbon film is between 4 Å and 10 Å thick and has a hardness greater than 100 GPa.

2. The composition of matter as recited in claim 1, wherein the ultra-hard diamond-like carbon film is between 4 Å and 7 Å thick.

3. The composition of matter as recited in claim 1, wherein the ultra-hard diamond-like carbon film is between 4 Å and 6 Å thick.

4. The composition of matter as recited in claim 1, wherein the ultra-hard diamond-like carbon film is optically transparent.

5. The composition of matter as recited in claim 1, wherein the composition of matter coats a protective armor.

6. The composition of matter as recited in claim 5, wherein the protective armor is a protective vest.

7. The composition of matter as recited in claim 5, wherein the protective armor is a protective helmet.

8. The composition of matter as recited in claim 1, wherein the compressed graphene was formed by uniaxially compressing a graphene film to the surface of the silicon carbide with a pressure between 1 GPa and 10 GPa, wherein the graphene film had a thickness between 4 Å and 10 Å.

9. The composition of matter as recited in claim 8, wherein the graphene film consists of two layers (2-L) of graphene.

10. The composition of matter as recited in claim 9, wherein the two-layers (2-L) of graphene consist of a buffer layer of graphene that is contiguous with a monolayer of graphene, wherein the buffer layer of graphene is contiguous with the surface of the silicon carbide.

11. The composition of matter as recited in claim 9, wherein the ultra-hard diamond-like carbon film has a Young's modulus greater than 0.3 TPa.

12. The composition of matter as recited in claim 9, wherein the ultra-hard diamond-like carbon film has a Young's modulus greater than 1 TPa.

13. A method for producing an ultra-hard diamond-like carbon film, the method comprising:
   uniaxially compressing a graphene film to a surface of silicon carbide with a pressure between 1 GPa and 10 GPa, wherein the graphene film has a thickness between 4 Å and 10 Å and consists of two layers (2-L) or three layers (3-L) of graphene, thereby forming the ultra-hard diamond-like carbon film with a thickness between 4 Å and 10 Å and a hardness greater than 100 GPa.

14. The method as recited in claim 13, wherein the graphene film consists of two layers (2-L) of graphene.

15. The method as recited in claim 13, wherein the ultra-hard diamond-like carbon film is optically transparent.

16. The method as recited in claim 13, wherein the compressing applies a force between 30 nanonewtons and 900 nanonewtons.

17. The method as recited in claim 13, wherein the graphene film has a thickness between 4 Å and 6 Å.

18. The method as recited in claim 13, wherein the uniaxially compressing transforms the graphene film to the ultra-hard diamond-like carbon film such that the ultra-hard diamond-like carbon film, relative to the graphene film, increases in hardness by at least 75 GPa to produce the hardness greater than 100 GPa.

* * * * *